(12) United States Patent
Gibbons et al.

(10) Patent No.: US 9,502,516 B2
(45) Date of Patent: Nov. 22, 2016

(54) RECESSED ACCESS DEVICES AND GATE ELECTRODES

(71) Applicant: Micron Technology, Inc., Boise, ID (US)

(72) Inventors: Jasper S. Gibbons, Meridian, ID (US); Darren V. Young, Meridian, ID (US); Kunal R. Parekh, Boise, ID (US); Casey Smith, Salt Lake City, UT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/247,968

(22) Filed: Apr. 8, 2014

(65) Prior Publication Data

US 2014/0217498 A1 Aug. 7, 2014

Related U.S. Application Data

(62) Division of application No. 13/276,141, filed on Oct. 18, 2011, now Pat. No. 8,692,320, which is a division of application No. 11/432,442, filed on May 11, 2006, now abandoned.

(51) Int. Cl.

| | | |
|---|---|---|
| *H01L 27/088* | (2006.01) | |
| *H01L 29/423* | (2006.01) | |
| *H01L 29/40* | (2006.01) | |
| *H01L 21/8234* | (2006.01) | |
| *H01L 29/66* | (2006.01) | |
| *H01L 29/78* | (2006.01) | |

(52) U.S. Cl.
CPC ..... *H01L 29/4236* (2013.01); *H01L 21/82345* (2013.01); *H01L 21/823425* (2013.01); *H01L 29/407* (2013.01); *H01L 29/66621* (2013.01); *H01L 29/7831* (2013.01)

(58) Field of Classification Search
CPC .......................... H01L 29/407; H01L 29/7831
USPC .......... 257/392, 532, 314, E29.134, E29.264
See application file for complete search history.

(56) References Cited

U.S. PATENT DOCUMENTS

| | | |
|---|---|---|
| 4,636,834 A | 1/1987 | Shepard |
| 4,714,519 A | 12/1987 | Pfiester |
| 5,013,680 A | 5/1991 | Lowrey et al. |
| 5,122,848 A | 6/1992 | Lee et al. |

(Continued)

FOREIGN PATENT DOCUMENTS

| | | |
|---|---|---|
| EP | 1772898 A1 | 4/2007 |
| EP | 1801856 A1 | 6/2007 |

(Continued)

OTHER PUBLICATIONS

Spee et al., Low Temperature Deposition of TiN Ceramic Material by Metal Organic and/or Plasma Enhanced CVD, Journal DE Physique IV, Jun. 1995; vol. 5: C5-719-C5-734.

(Continued)

*Primary Examiner* — Robert Huber
(74) *Attorney, Agent, or Firm* — TraskBritt

(57) ABSTRACT

Recessed access transistor devices used with semiconductor devices may include gate electrodes having materials with multiple work functions, materials that are electrically isolated from each other and supplied with two or more voltage supplies, or materials that create a diode junction within the gate electrode.

12 Claims, 17 Drawing Sheets

(56) References Cited

U.S. PATENT DOCUMENTS

| | | |
|---|---|---|
| 5,208,177 A | 5/1993 | Lee |
| 5,547,890 A | 8/1996 | Tseng |
| 5,583,065 A | 12/1996 | Miwa |
| 5,619,057 A | 4/1997 | Komatsu |
| 5,714,412 A | 2/1998 | Liang et al. |
| 5,909,618 A | 6/1999 | Forbes et al. |
| 5,937,280 A * | 8/1999 | Wen .................. H01L 27/1021 257/E27.073 |
| 5,941,701 A | 8/1999 | Moran et al. |
| 5,953,614 A | 9/1999 | Liu et al. |
| 5,960,270 A | 9/1999 | Misra et al. |
| 5,963,469 A | 10/1999 | Forbes |
| 5,977,579 A | 11/1999 | Noble |
| 6,033,963 A | 3/2000 | Huang et al. |
| 6,072,209 A | 6/2000 | Noble et al. |
| 6,090,692 A | 7/2000 | Song |
| 6,121,100 A | 9/2000 | Andideh et al. |
| 6,130,453 A | 10/2000 | Mei et al. |
| 6,147,377 A | 11/2000 | Liu et al. |
| 6,150,687 A | 11/2000 | Noble et al. |
| 6,187,619 B1 | 2/2001 | Wu |
| 6,191,470 B1 | 2/2001 | Forbes et al. |
| 6,215,149 B1 | 4/2001 | Lee et al. |
| 6,225,669 B1 | 5/2001 | Long et al. |
| 6,259,142 B1 | 7/2001 | Dawson et al. |
| 6,294,434 B1 | 9/2001 | Tseng |
| 6,300,177 B1 | 10/2001 | Sundaresan et al. |
| 6,313,046 B1 | 11/2001 | Juengling et al. |
| 6,343,114 B1 | 1/2002 | Chea, Jr. |
| 6,373,114 B1 | 4/2002 | Jeng et al. |
| 6,383,879 B1 | 5/2002 | Kizilyalli et al. |
| 6,476,444 B1 | 11/2002 | Min |
| 6,498,062 B2 | 12/2002 | Durcan et al. |
| 6,534,402 B1 | 3/2003 | Liao |
| 6,534,837 B1 | 3/2003 | Bai et al. |
| 6,548,870 B1 | 4/2003 | Lee |
| 6,552,401 B1 | 4/2003 | Dennison |
| 6,562,713 B1 | 5/2003 | Belyansky et al. |
| 6,566,708 B1 | 5/2003 | Grover et al. |
| 6,607,958 B2 | 8/2003 | Suguro |
| 6,630,720 B1 | 10/2003 | Maszara et al. |
| 6,653,698 B2 | 11/2003 | Lee et al. |
| 6,696,746 B1 | 2/2004 | Farrar et al. |
| 6,841,834 B2 | 1/2005 | Nowak |
| 6,844,578 B2 | 1/2005 | Harada et al. |
| 6,844,591 B1 | 1/2005 | Tran |
| 6,924,190 B2 | 8/2005 | Dennison |
| 6,939,765 B2 | 9/2005 | Kim et al. |
| 6,956,263 B1 | 10/2005 | Mistry |
| 6,963,108 B1 | 11/2005 | Kang et al. |
| 6,987,040 B2 | 1/2006 | Venkatraman |
| 7,029,966 B2 | 4/2006 | Amos et al. |
| 7,045,406 B2 | 5/2006 | Huotari et al. |
| 7,071,043 B2 | 7/2006 | Tang et al. |
| 7,122,425 B2 | 10/2006 | Chance et al. |
| 7,141,858 B2 | 11/2006 | Polishchuk et al. |
| 7,148,100 B2 | 12/2006 | Kim et al. |
| 7,202,535 B2 | 4/2007 | Goldbach et al. |
| 7,214,621 B2 | 5/2007 | Nejad et al. |
| 7,229,873 B2 | 6/2007 | Colombo et al. |
| 7,244,659 B2 | 7/2007 | Tang et al. |
| 7,262,089 B2 | 8/2007 | Abbott et al. |
| 7,282,401 B2 | 10/2007 | Juengling |
| 7,285,812 B2 | 10/2007 | Tang et al. |
| 7,316,950 B2 | 1/2008 | Park et al. |
| 7,319,255 B2 | 1/2008 | Hwang et al. |
| 7,332,433 B2 | 2/2008 | Choi et al. |
| 7,349,232 B2 | 3/2008 | Wang et al. |
| 7,384,849 B2 | 6/2008 | Parekh et al. |
| 7,408,806 B2 | 8/2008 | Park et al. |
| 7,456,469 B2 | 11/2008 | Yamazaki |
| 7,470,588 B2 | 12/2008 | Cho et al. |
| 7,563,677 B2 | 7/2009 | Yoo et al. |
| 7,564,061 B2 | 7/2009 | Mimura |
| 7,666,727 B2 | 2/2010 | Doyle et al. |
| 7,709,380 B2 | 5/2010 | Veloso |
| 7,824,986 B2 | 11/2010 | Gurtej et al. |
| 7,867,851 B2 | 1/2011 | Hanson et al. |
| 7,875,919 B2 | 1/2011 | Booth, Jr. et al. |
| 7,902,597 B2 | 3/2011 | Lee et al. |
| 7,968,463 B2 | 6/2011 | Nakagawa et al. |
| 8,034,687 B2 | 10/2011 | Gurtej et al. |
| 8,404,543 B2 | 3/2013 | Shin et al. |
| 8,692,320 B2 * | 4/2014 | Gibbons et al. .............. 257/330 |
| 2002/0028541 A1 | 3/2002 | Lee et al. |
| 2002/0106858 A1 | 8/2002 | Zheng et al. |
| 2002/0132473 A1 | 9/2002 | Chiang et al. |
| 2002/0146878 A1 | 10/2002 | Ohnakado et al. |
| 2003/0170955 A1 | 9/2003 | Kawamura et al. |
| 2003/0203566 A1 | 10/2003 | McQueen et al. |
| 2004/0113202 A1* | 6/2004 | Kocon .................. H01L 29/402 257/330 |
| 2004/0212024 A1 | 10/2004 | Oh et al. |
| 2005/0048729 A1 | 3/2005 | Yoon et al. |
| 2005/0139926 A1 | 6/2005 | Shimizu et al. |
| 2005/0167695 A1* | 8/2005 | Yilmaz ......................... 257/134 |
| 2005/0202632 A1 | 9/2005 | Ding |
| 2005/0233533 A1 | 10/2005 | Alshareef et al. |
| 2005/0242392 A1* | 11/2005 | Pattanayak et al. .......... 257/328 |
| 2005/0275042 A1 | 12/2005 | Hwang et al. |
| 2006/0017099 A1 | 1/2006 | Paik |
| 2006/0046354 A1 | 3/2006 | Kreipl |
| 2006/0081947 A1 | 4/2006 | Mimura |
| 2006/0084247 A1 | 4/2006 | Liu |
| 2006/0131636 A1 | 6/2006 | Jeon et al. |
| 2006/0141728 A1 | 6/2006 | Pawlak |
| 2006/0157796 A1 | 7/2006 | Kim et al. |
| 2007/0015325 A1 | 1/2007 | Goldbach et al. |
| 2007/0026595 A1 | 2/2007 | Fukutome et al. |
| 2007/0077713 A1 | 4/2007 | Ha et al. |
| 2007/0148886 A1 | 6/2007 | Veloso |
| 2007/0221970 A1 | 9/2007 | Kadoshima et al. |
| 2007/0262395 A1 | 11/2007 | Gibbons et al. |
| 2007/0262415 A1 | 11/2007 | Smith et al. |
| 2007/0264771 A1 | 11/2007 | Ananthan et al. |
| 2008/0017921 A1 | 1/2008 | Jung |
| 2008/0099801 A1 | 5/2008 | Lee et al. |
| 2008/0146012 A1 | 6/2008 | Lin et al. |
| 2008/0230844 A1 | 9/2008 | Yu et al. |
| 2008/0261366 A1 | 10/2008 | Jeon et al. |
| 2009/0035901 A1 | 2/2009 | Lin |
| 2009/0170252 A1 | 7/2009 | Nakagawa et al. |
| 2009/0230463 A1 | 9/2009 | Carter et al. |
| 2011/0260242 A1 | 10/2011 | Jang |
| 2012/0061751 A1 | 3/2012 | Gibbons et al. |
| 2013/0161734 A1 | 6/2013 | Wu |

FOREIGN PATENT DOCUMENTS

| | | |
|---|---|---|
| JP | 2006013332 A | 1/2006 |
| JP | 2006100403 A | 4/2006 |
| JP | 2006173633 A | 6/2006 |
| JP | 2007208242 A | 8/2007 |
| JP | 2007251030 A | 9/2007 |
| WO | 2004107421 A1 | 12/2004 |
| WO | 2007139041 A1 | 12/2007 |

OTHER PUBLICATIONS

Supplementary European Search Report for EP09825209, dated Nov. 16, 2012, 9 pages.

Zamouche et al., Investigation of Fast Diffusing Impurities in Silicon by a Transient Ion Drift Method, Appl. Phys. Lett., Jan. 1995; 66(5): 631-633.

International Search Report for International Application No. PCT/US2009/061823, mailed May 17, 2010, 3 pages.

* cited by examiner

RECESSED ACCESS DEVICES AND GATE ELECTRODES

CROSS-REFERENCE TO RELATED APPLICATIONS

This application is a divisional of U.S. patent application Ser. No. 13/276,141, filed Oct. 18, 2011, now U.S. Pat. No. 8,692,320, issued Apr. 8, 2014, which is a divisional of U.S. patent application Ser. No. 11/432,442, filed May 11, 2006, abandoned, which application was related to U.S. patent application Ser. No. 11/432,270, filed May 11, 2006, now U.S. Pat. No. 8,008,144, issued Aug. 30, 2011, and U.S. patent application Ser. No. 11/495,805, filed Jul. 28, 2006, now U.S. Pat. No. 8,860,174, issued Oct. 14, 2014, the entire disclosure of each of which is hereby incorporated in its entirety herein by this reference. This application is also related to U.S. patent application Ser. No. 13/196,527, filed Aug. 2, 2011, now U.S. Pat. No. 8,710,583, issued Apr. 29, 2014.

BACKGROUND

Field of the Invention

The invention relates to MOSFET devices and, in particular, to recessed access devices for semiconductor devices and methods of making the same.

Technical Background

Semiconductor devices employ access devices to store and retrieve data stored in memory circuits. The access devices may include semiconductor structures such as transistor devices, and can be in the form of planar or recessed access device structures. The gate electrode of an access device is biased, by an access device driver circuit, providing "on" and "off" states for the access device and facilitating the access and storage of data in the memory circuit utilizing the access devices. When the device is "on," current is allowed to flow through the access device, and therefore the transistor is in inversion. When the device is "off," current is supposed to be blocked from flowing through the access device, and therefore the transistor is in accumulation.

FIG. 1 illustrates a conventional planar access device (PAD) or transistor device, used with semiconductor memory circuits. A gate stack 60 is formed over a semiconductor substrate 50. The gate stack 60 includes a gate-oxide layer 62, a gate electrode 64, an insulator cap 66, and sidewall spacers 68. Source and drain regions 54 are located on either side of the gate stack 60 forming the transistor device.

FIG. 2 illustrates a conventional recessed access device (RAD) used with semiconductor memory circuits. The RAD structure includes a gate stack 70 formed in trenches of a semiconductor substrate 50. The gate stack 70 includes a gate-oxide layer 72, a gate electrode 74, an insulator cap 76, and sidewall spacers 78. Source and drain regions 54 are located on either side of the gate stack 70 forming the RAD device.

The PAD and RAD structures illustrated in FIGS. 1 and 2 may be used as access devices for memory circuits. As the dimensional requirements of semiconductor structures continue to diminish in size, fabrication processes are developed to accommodate the shrinking dimensions. For a memory circuit, utilizing either a PAD or RAD structure as the access device, there are three major undesirable leakage paths in the transistor: subthreshold leakage, gate induced drain leakage (GIDL), and junction leakage. Each leakage type occurs when the access device is in accumulation, or the "off" state. Subthreshold leakage is the leakage of charge between the source and drain of the access device and increases with smaller transistor dimensions, specifically the effective length of the gate in an access device. One way of reducing the subthreshold leakage is to apply a more negative voltage to the gate electrode of the access device in the "off" state. For example, in an "off" state, a negative voltage is applied to the PAD gate electrode 64 or the RAD gate electrode 74, illustrated in FIGS. 1 and 2, respectively. However, the application of a more negative voltage to the gate electrode results in higher GIDL current in the access device. Another way of reducing the subthreshold leakage is to apply a more negative voltage to the substrate 50. However, the application of a more negative voltage to the substrate results in increased junction leakage. Subthreshold leakage may also be decreased by employing a high work function difference between the source and drain regions and a gate electrode, for example, by employing a P+ gate and an N+ source/drain region. However, GIDL current increases in such cases.

Furthermore, the RAD gate stack 70, and the use of RAD gate stacks 70 with semiconductor devices, increases the effective length of a gate in an access device compared to the PAD gate stack 60. The increased length of the gate tends to decrease the amount of subthreshold leakage in the access device. However, the GIDL current from the RAD gate stack 70 is greater than the GIDL current of PAD gate stack 60. It is believed that the increased amount of GIDL loss in the RAD gate stack 70 is the result of the increased overlap of the source/drain regions 54 with the gate electrode 74.

Therefore, it is desirable to develop an access device for use with memory devices and other semiconductor devices that may be able to reduce subthreshold leakage, junction leakage, and gate induced drain leakage simultaneously. It is also desirable to develop processes for fabricating such devices using conventional semiconductor fabrication processes.

BRIEF DESCRIPTION OF THE DRAWINGS

While the specification concludes with claims particularly pointing out and distinctly claiming that which is regarded as the present invention, this invention can be more readily understood and appreciated by one of ordinary skill in the art from the following description of the invention when read in conjunction with the accompanying drawings in which:

DETAILED DESCRIPTION

Figure 1:
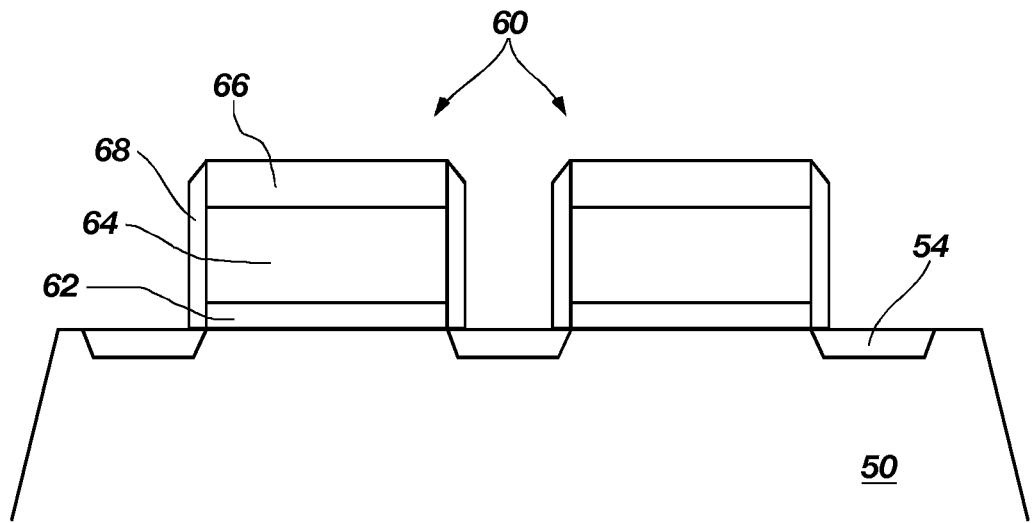
FIG. 1 illustrates a cross-sectional view of a conventional planar access device such as a memory access device.
Figure 2:
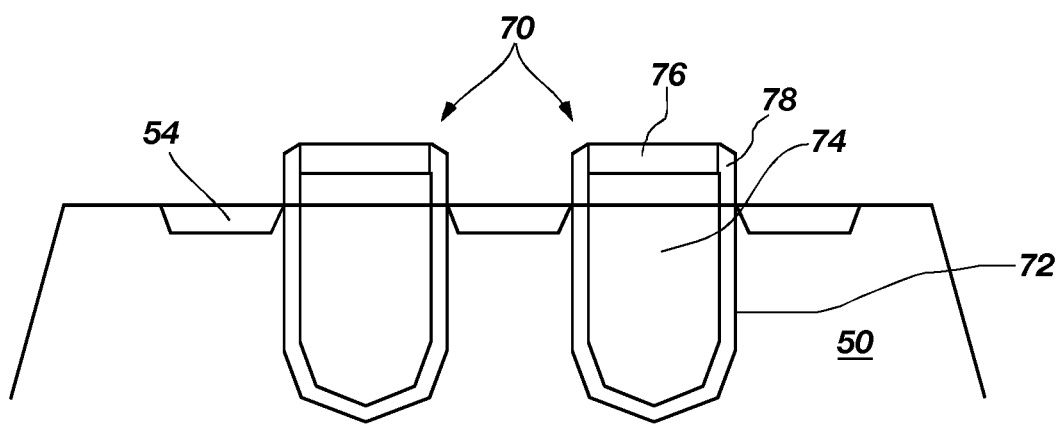
FIG. 2 illustrates a cross-sectional view of a conventional recessed access device such as a memory access device.

Embodiments of the invention relate to planar and recessed access transistor devices used in semiconductor devices. More particularly, embodiments of the invention relate to planar and recessed access devices that may be used with CMOS semiconductor devices or memory devices such as DRAM memory devices. However, the embodiments of the invention are not limited to such devices as the planar and recessed access devices of the invention may be used with any semiconductor device.

According to some embodiments of the invention, a planar or recessed access device may include a gate electrode having two or more gate materials wherein each of the gate materials has a different work function than the other gate materials of the gate electrode. The presence of the two or more work functions in the gate electrode may help to reduce the amount of gate induced drain leakage that occurs in the gate stack or recessed access device. Furthermore, the reduction of the gate induced drain leakage may be accomplished without sacrificing additional losses due to sub-threshold leakage or junction leakage, which is controlled by the difference and margin bias provided by the different work function materials in the gate electrode.

According to other embodiments of the invention, a planar or recessed access device may include a gate electrode having two or more electrically isolated regions. The electrically isolated regions of the gate electrode may be supplied by different voltage supplies such that different voltages may be supplied to and across the length of a gate electrode. Further, the same voltage may be supplied to each of the electrically isolated regions. The planar and recessed access devices may be turned into an "on" state or an "off" state depending upon the voltages supplied by the different voltage supplies.

The electrically isolated regions allow different margin biases to be supplied to different portions of the gate electrode, which in turn may be used to control gate induced drain leakage in the planar or recessed access device. In addition, the voltages supplied to the electrically isolated regions during the "on" state and "off" state may be altered to control the subthreshold leakage and junction leakage of the planar or recessed access device. In this manner, the gate induced drain leakage may be controlled or reduced without sacrificing losses to subthreshold leakage and junction leakage.

According to still other embodiments of the invention, a planar or recessed access device may include a gate electrode having a cathode region and an anode region, wherein the cathode and anode form a diode in the gate electrode. Each of the cathode and anode may be connected to separate voltage supplies such that different or similar voltages may be supplied to and across the length of the gate electrode. The voltages supplied to the anode and cathode may be tailored such that when the gate stack or recessed access device is in an "off" state the gate induced drain leakage is minimized. The margin bias provided across the diode may also be used to minimize the subthreshold leakage and junction leakage.

In still other embodiments of the invention, an access device driver is provided, wherein the access device driver may supply two or more voltages to a planar or recessed access device. Access device drivers according to embodiments of the invention may be able to provide dissimilar or similar voltages to a planar or recessed access device having two or more electrically isolated regions in a gate electrode or to a gate electrode comprising a diode. The control of voltages to the planar or recessed access device by the access device driver may facilitate the control of the gate induced drain leakage, subthreshold leakage, and junction leakage of a planar or recessed access device.

According to embodiments of the invention, an access device of a memory cell includes one or more gates in a memory or semiconductor device that are capable of reducing an amount of gate-induced drain leakage (GIDL) in the access device. An access device may include a gate electrode or gate diode capable of accepting two voltages simultaneously. In other embodiments, the access device may include gate electrodes comprising two or more materials having different work functions.

According to some embodiments of the invention, gate-induced drain leakage may be reduced by forming an access device or transistor gate stack from materials having differing work functions. For example, an access device or gate stack may be formed from two or more materials having dissimilar work functions. A material having a higher work function may be used to form those portions of the gate stack where sub-threshold leakage is problematic while a material having a lower work function may be used to form those portions of the gate stack where gate-induced drain leakage is a concern. For example, a gate stack having two or more gate materials may be formed such that a gate material closest to a storage capacitor has a lower work function than the gate material closest to the bitline of a memory device. The dissimilar work function materials may be separated by a barrier layer and strapped together by a metal or conductive strap. The barrier layer may comprise a conductive material and may serve as a conductive strap.

Unlike conventional planar access devices, which employ a material having a consistent work function to form a gate electrode or gate stack of an access device, embodiments of the present invention may employ one or more materials in the gate stack of an access device to decrease or control GIDL. For example, access devices according to embodiments of the invention may be used in semiconductor devices as planar access devices or transistors incorporated with memory devices. Embodiments of the invention are especially useful in memory devices such as in dynamic random access memory (DRAM) devices but are not limited to such use.

Figure 3:
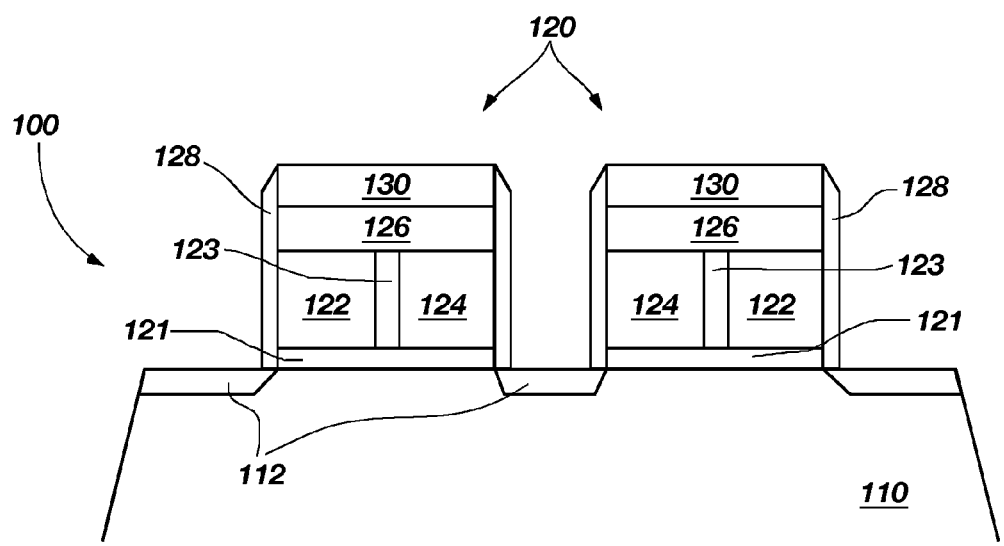
FIG. 3 illustrates a cross-sectional view of a planar access device according to embodiments of the invention.

An access device 100 according to embodiments of the invention is illustrated in FIG. 3. The access device 100 may include one or more gate stacks 120 formed over a semiconductor substrate 110. Gate stacks 120 may include an oxide layer 121 and a gate electrode over the oxide layer. The gate electrode may include a first gate material 122 having a first work function associated therewith and a second gate material 124 having a second work function associated therewith. As illustrated in FIG. 3, the gate materials may be separated by a separator 123. One or more straps 126 may overlie the first gate material 122 and second gate material 124. The straps 126 may provide an electrical connection between the first and second gate materials. A gate stack 120 may also include an insulator cap 130 and sidewall spacers 128 as known and used with conventional planar access devices. The gate stacks 120 may overlie source and drain regions 112 in the semiconductor substrate 110.

The semiconductor substrate 110 may include semiconductor substrates conventionally used with or for the fabrication of memory devices, access devices, and other semiconductor devices. In many embodiments, the semiconductor substrate 110 may include a silicon-containing structure such as silicon, silicon-on-insulator structures, and silicon-on-sapphire structures.

Oxide layer 121 may include any oxide material that may be used to form oxide layers 121 capable of being used with conventional gate stacks devices and particularly with gate stacks or other transistor devices integrated with memory devices or semiconductor devices.

The gate electrodes of embodiments of the invention may include multiple gate materials. As illustrated in FIG. 3, a gate electrode may include a first gate material 122 and a second gate material 124. Preferably, the first gate material 122 and the second gate material 124 have differing work functions. Use of gate materials having differing work functions to form the gate electrodes may reduce the effects of gate induced drain leakage (GIDL) in the access device 100. For example, the first gate material 122 of the gate stack 120 illustrated in FIG. 3 may include an N+ doped polysilicon material and the second gate material 124 may include a P+ doped polysilicon material. The N+ doping of the first gate material 122 provides the first gate material 122 with a lower work function than the P+ doped material of the second gate material 124. The P+ second gate material 124 maintains a high threshold voltage $V_t$ for the access device 100, thereby reducing the subthreshold leakage while the N+ first gate material 122 decreases the GIDL in the access device 100.

Although embodiments of the invention have been described having two gate materials it is understood that the gate electrodes may be formed of two or more gate materials. For example, a gate electrode may include gate materials having differing work functions in a horizontal cross-section of the gate electrode as illustrated in FIG. 3 as well as differing work functions in a vertical cross-section of the gate electrode. The first gate material, for example, may include a varying work function across a vertical cross-section from the oxide layer 121 to the insulator cap 130. Similarly, the second gate material 124 may include a varying work function across a vertical cross-section from the oxide layer 121 to the insulator cap 130.

A separator 123 may be positioned between the first gate material 122 and the second gate material 124 and may include insulating materials, conductive materials, metals, or other materials capable of separating the gate materials. For example, separator 123 may be formed of a nitride, an oxide, a silicide, a conductive metal, or a metallic alloy. In some embodiments, the separator 123 may prevent cross-diffusion of the first gate material 122 with the second gate material 124 or prevent cross-diffusion of dopants between the gate materials, especially during subsequent heating processes utilized in the fabrication of a semiconductor device.

In some embodiments, the strap 126 may be a conductive strap providing an electrical connection between the first gate material 122 and the second gate material 124. Exemplary materials that may be used as a conductive strap 126 include metals, as well as conductive silicon materials, doped silicon materials including conductively doped polycrystalline silicon, and other conductors. In other embodiments, the strap 126 need not be conductive. For instance, if the separator 123 provides an electrical connection between the first gate material 122 and the second gate material 124, the strap 126 may not provide an electrical connection between the gate materials. In those embodiments where such an electrical connection between the first gate material 122 and the second gate material 124 exists, a conductive strap 126 is not necessary but may be used.

The insulator cap 130 of the gate stacks 120 may include any insulating material that may be used as an insulating layer for conventional planar devices. For instance, the insulator cap 130 may be formed of a nitride or an oxide, such as silicon dioxide.

Similarly, the sidewall spacers 128 may be formed from materials used to form spacers 128 with conventional gate stack devices and access devices 100. For example, the spacers 128 may include materials such as silicon dioxide or other oxides, silicon nitride, or other nitrides, or silicon oxynitride.

Figure 4A:
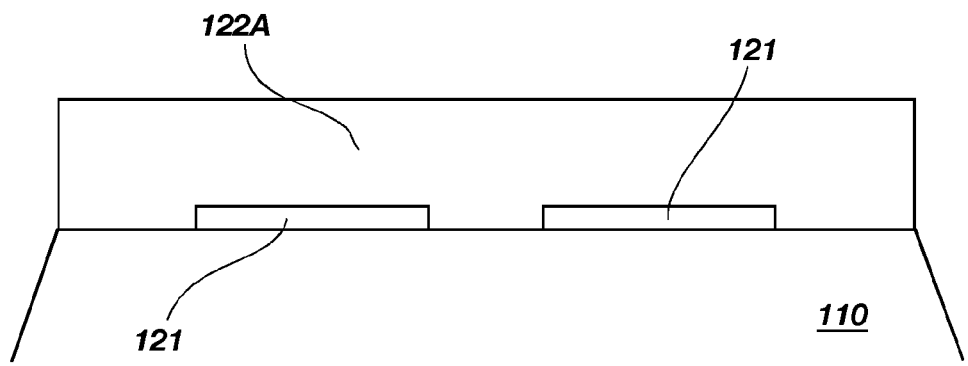
FIGS. 4A-4E illustrate cross-sectional views of various process steps in the fabrication of the planar access device illustrated in FIG. 3 according to embodiments of the invention.
Figure 4B:
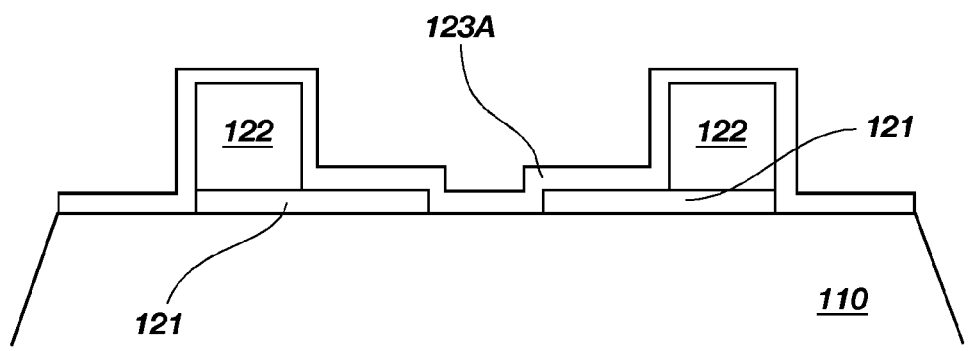
Figure 4C:
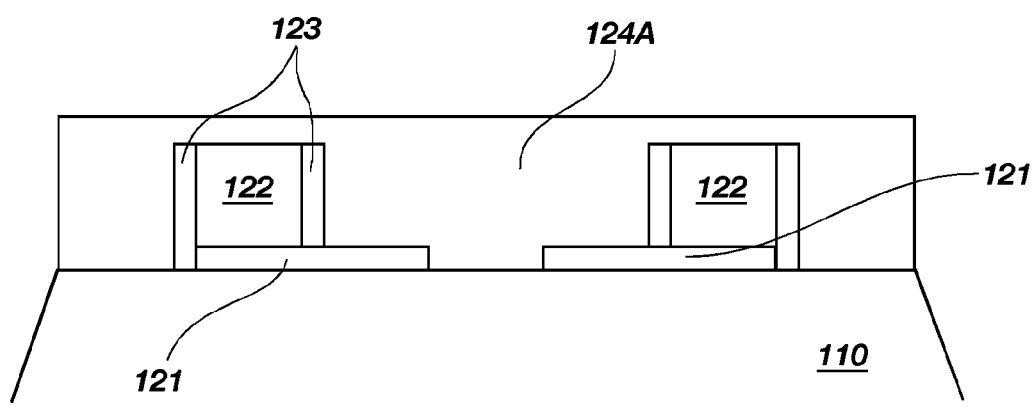
Figure 4D:
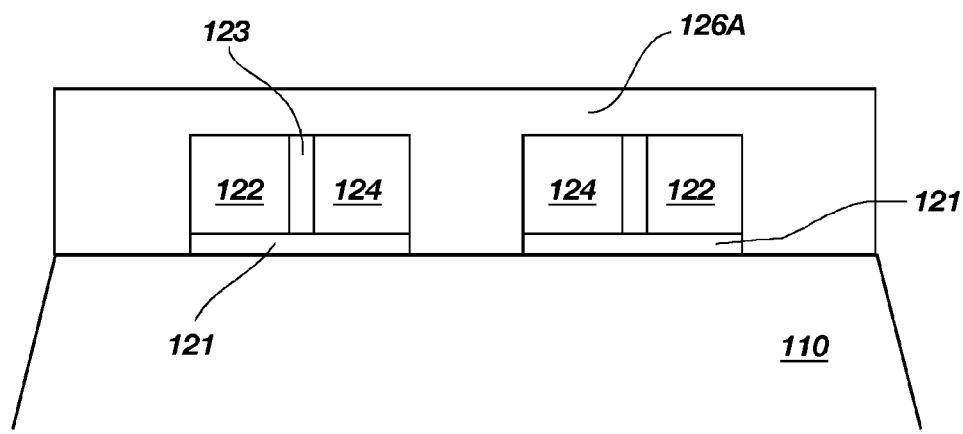
Figure 4E:
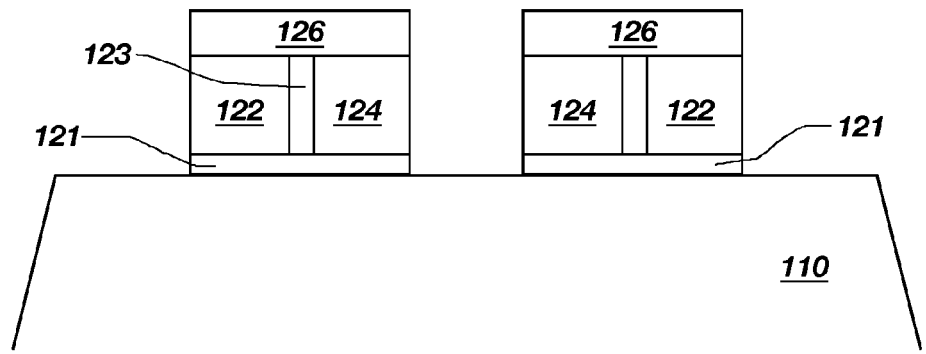

The gate stacks 120 of embodiments of the invention may be produced using fabrication processes used to form conventional semiconductor devices and particularly memory devices. For example, the gate stacks illustrated in FIG. 3 may be formed using conventional CMOS or memory device fabrication processes as illustrated in FIGS. 4A-4E. As illustrated in FIG. 4A, a polysilicon layer 122A may be deposited over a gate-oxide layer 121 overlying a semiconductor substrate 110. The polysilicon layer 122A may then be masked and etched according to conventional processes to form the first gate material 122 of the gate stack 120 as illustrated in FIG. 4B. A separator layer 123A may be deposited over the first gate material 122 and the semiconductor substrate 110. Etching of the separator layer 123A leaves the separator 123 formed on the sides of the first gate material 122. A second polysilicon material 124A may be deposited over the first gate material 122, the separator 123, and the semiconductor substrate 110 as illustrated in FIG. 4C. Masking and etching of the second polysilicon material 124A may result in the formation of the second gate material 124 of the gate stacks 120 as illustrated in FIG. 4D. A strap material 126A deposited over the first gate material 122, separator 123, and second gate material 124 as illustrated in FIG. 4D may be masked and etched to form the strap 126 illustrated in FIG. 4E. Conventional masking, etching, doping, and deposition processes may be used to complete the formation of the gate stacks 120 including the formation of the insulator caps 130 and sidewall spacers 128, and the doping of the source and drain regions 112.

Although methods for forming the gate stacks 120 of particular embodiments of the invention are illustrated in FIGS. 4A-4E, it is understood that other methods and processes may also be used to fabricate gate stacks 120 according to embodiments of the invention. In addition, it is understood that the order of formation of the first gate material 122, separator 123, and second gate material 124 is only exemplary. The gate materials 122 and 124, and the separator 123, may be formed in any desired order. Furthermore, the first gate material 122 and the second gate material 124 may be formed simultaneously out of the same polysilicon material. Subsequent doping of the first gate material 122 and second gate material 124 may establish a desired difference in work function of the two materials. In addition, the oxide layer 121 overlying the semiconductor substrate 110 may be a continuous oxide layer (not shown) which may be etched or otherwise removed during the fabrication process.

Figure 5:
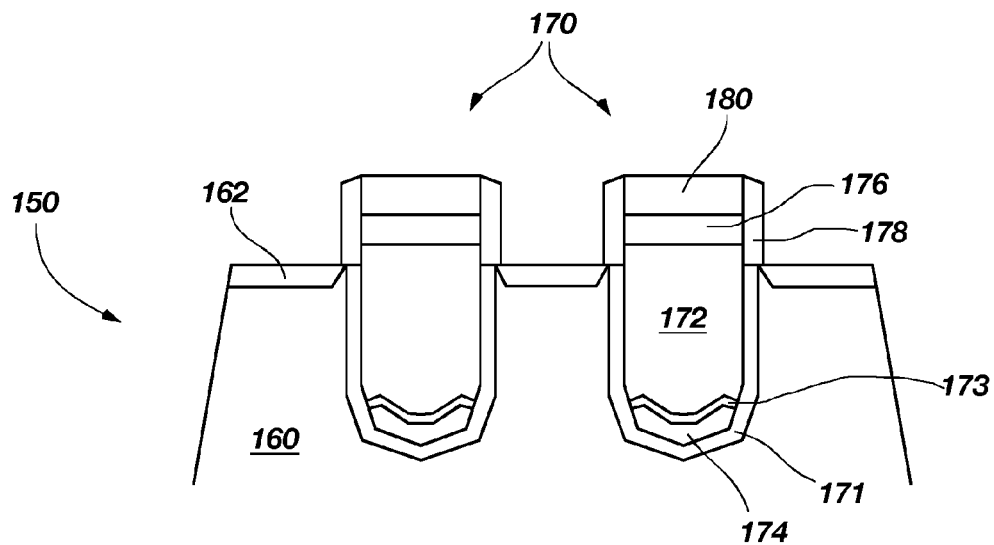
FIG. 5 illustrates a cross-sectional view of a recessed access device structure according to embodiments of the invention.

According to other embodiments of the invention, an access device 150 may include one or more recessed access device (RAD) structures 170 wherein the RAD structures 170 include two or more materials having different work functions. For example, exemplary RAD structures 170 according to embodiments of the invention are illustrated in FIG. 5.

The RAD structures 170 may be formed in trenches of a semiconductor substrate 160 between active areas 162 such as source and drain regions or bitlines and storage capacitors for memory devices. The trenches in the semiconductor substrate 160 may be lined with a gate-oxide 171 as used with conventional RAD structures. The RAD structures 170 may include a first gate material 172 overlying a second gate material 174 in a trench of the semiconductor substrate 160. The first gate material 172 and the second gate material 174 may be separated by a metal barrier 173 or other conductive barrier as illustrated in FIG. 5. The RAD structures 170 may also include a strap 176 overlying the first gate material 172 and an insulator cap 180 overlying the strap 176. Gate electrode sidewall spacers 178 may also be formed with the RAD structures 170 to complete the trenched gate stack.

According to embodiments of the invention, the second gate material 174 of the RAD structures 170 may be formed of a material having a higher work function than the first gate material 172. For example, the second gate material 174 used to form the RAD structures 170 illustrated in FIG. 5 may include a P+ doped polysilicon material and the first gate material 172 may include an N+ doped polysilicon material. Other materials having differing work functions may also be used to form RAD structures 170 according to embodiments of the invention.

The metal barrier 173 between the first gate material 172 and the second gate material 174 may provide an ohmic contact between the two gate materials. The metal barrier 173 may include metals such as tungsten, aluminum, copper, or titanium. In some embodiments, the metal barrier 173 may be formed from one or more metal layers. The metal layers may include similar or dissimilar metals. In other embodiments, the metal barrier 173 may be substituted with a barrier material (not shown) that may provide an electrical connection or conduction between the first gate material 172 and the second gate material 174. In addition, the barrier material may prevent diffusion of dopants between the two gate materials. The barrier layer may also be an insulator or may include layers of conductors, conductors and insulators, or insulators.

In some embodiments, the strap 176 may be a conductive material, such as a metal, a conductive silicon material, a doped silicon material, or another conductor. In other embodiments, the strap 176 need not be conductive.

The insulator cap 180 of the RAD structures 170 may include any insulating material that may be used as an insulating layer for conventional planar or recessed access devices. For instance, the insulator cap 180 may be formed of a nitride or an oxide such as silicon dioxide.

Similarly, the sidewall spacers 178 may be formed from materials used to form spacers 178 with conventional planar or recessed access devices. For example, the sidewall spacers 178 may include materials such as silicon dioxide or other oxides, silicon nitride, or other nitrides, or silicon oxynitride.

Figure 6A:
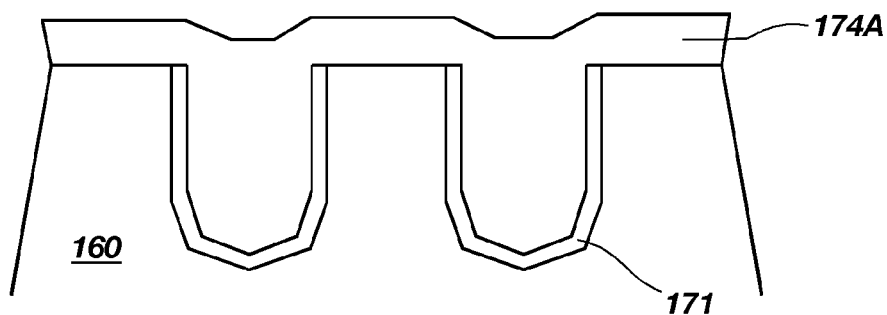
FIGS. 6A-6E illustrate cross-sectional views of various process steps in the fabrication of the recessed access device structure illustrated in FIG. 5 according to embodiments of the invention.
Figure 6B:
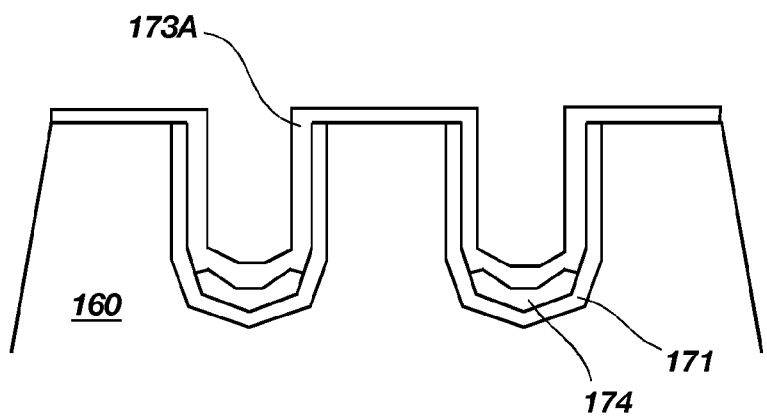
Figure 6C:
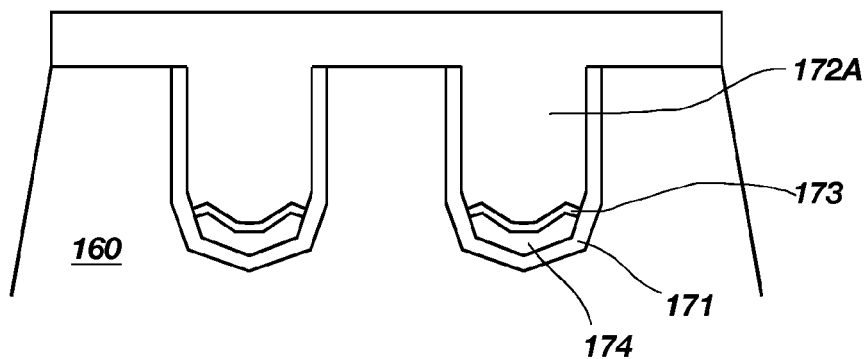
Figure 6D:
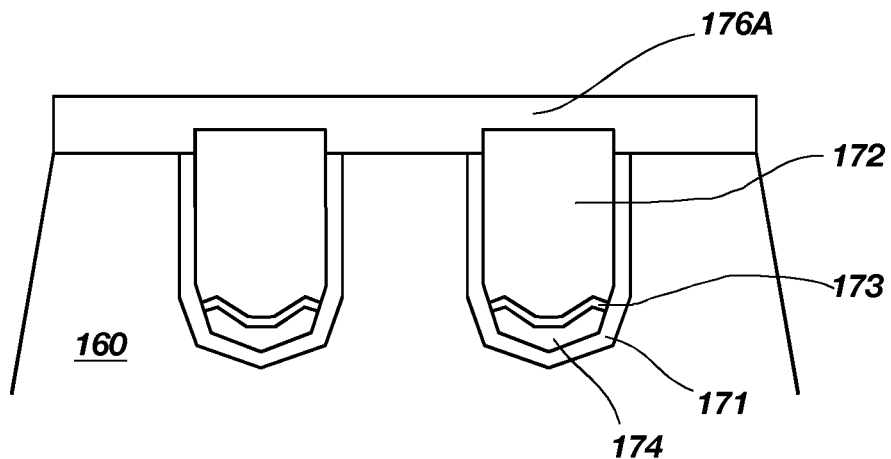
Figure 6E:
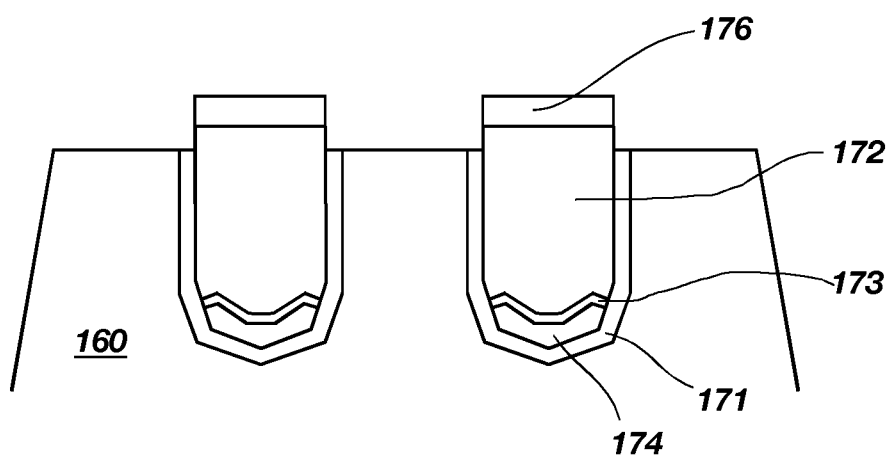

The RAD structures 170 of embodiments of the invention may be produced using fabrication processes used to form conventional semiconductor devices and particularly memory devices. For example, the RAD structures 170 illustrated in FIG. 5 may be formed using conventional CMOS or memory device fabrication processes similar to the steps illustrated in FIGS. 6A-6E. As illustrated in FIG. 6A, a semiconductor substrate 160 having trenches formed therein may be provided. Gate-oxide 171 may be grown in the trenches as used with conventional RAD structures. A polysilicon layer 174A may be deposited over the semiconductor substrate 160 and in the trenches. Masking and/or etching of the polysilicon layer 174A may be performed to form the second gate material 174 in the bottoms of the trenches of the semiconductor substrate 160 as illustrated in FIG. 6B. A barrier layer 173A may be deposited over the second gate material 174 and the semiconductor substrate 160. Masking and/or etching of the barrier layer 173A may form the metal barrier 173 over the second gate material 174 in the bottom of the trenches as illustrated in FIG. 6C. A second polysilicon layer 172A may be deposited over the semiconductor substrate 160 and in the trenches over the metal barrier 173 as illustrated in FIG. 6C. Masking and/or etching of the second polysilicon layer 172A may form the first gate material 172 as illustrated in FIG. 6D. The masking and/or etching of the second polysilicon layer 172A may be performed such that a portion of the first gate material 172 extends above a surface of the semiconductor substrate 160. A strap material 176A deposited over the first gate material 172 may be masked and/or etched to form the strap 176 over the first gate material 172 as illustrated in FIG. 6E. Conventional masking, etching, doping, and deposition processes may be used to complete the formation of the RAD structures 170, including the formation of insulator caps 180 and sidewall spacers 178, and the doping of the active areas 162.

Although methods for forming the RAD structures 170 of particular embodiments of the invention are illustrated in FIGS. 6A-6E, it is understood that other methods and processes may also be used to fabricate RAD structures 170 according to embodiments of the invention.

When employed with access devices, such as memory devices or other semiconductor devices, the gate stacks 120 and RAD structures 170 of embodiments of the invention may reduce GIDL, reduce junction leakage, reduce subthreshold leakage, and increase the drive of the access device. The combination of multiple work functions in the gate electrodes of the gate stack 120 and RAD structures 170 allows sub-threshold leakage to be controlled or reduced using a high work function material while also employing a low work function material to reduce GIDL. The increased margin to GIDL provided by the dual work function gate electrode allows the negative access device bias to be pushed more negative, which in turn may reduce the sub-threshold leakage. The decreased subthreshold leakage may allow a less negative substrate bias to be used with embodiments of the invention to decrease junction leakage and increase the drive of the access device.

Figure 7A:
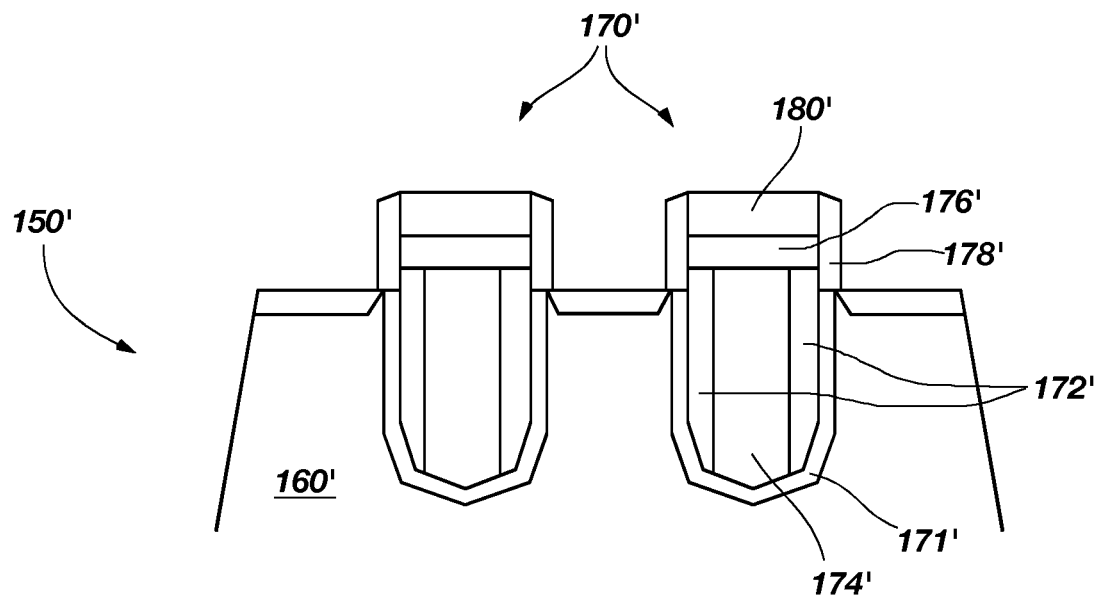
FIG. 7A illustrates a cross-sectional view of a recessed access device structure according to embodiments of the invention.

According to other embodiments of the invention, an access device 150' having one or more RAD structures 170' with two or more materials having different work functions may include a RAD structure 170' having a first gate material 172' positioned along at least a portion of the sidewalls of the RAD structure 170' and a second gate material 174' at least partially surrounded by the first gate material 172' as illustrated in FIG. 7A. As with other embodiments of the invention, trenches in the semiconductor substrate 160' may include a gate-oxide 171' layer on the sidewalls of the trenches. The first gate material 172' may be positioned along at least a portion of the gate-oxide 171' layer and the second gate material 174' may be positioned with respect to the first gate material 172' as illustrated. A barrier layer (not shown) may be formed between the first gate material 172' and the second gate material 174'. The RAD structures 170' may also include a strap 176' overlying the first gate material 172' and second gate material 174' and an insulator cap 180' overlying the strap 176'. Gate electrode sidewall spacers 178' may also be formed with the RAD structures 170' to complete the trenched gate stack 170'.

According to embodiments of the invention, the second gate material 174' of the RAD structures 170' may be formed of a material having a higher work function than the first gate material 172'. For example, the second gate material 174' used to form the RAD structures 170' illustrated in FIG. 7A may include a p-doped polysilicon material and the first gate material 172' may include an n-doped polysilicon material. Other materials having differing work functions may also be used to form RAD structures 170' according to embodiments of the invention.

Figure 7B:
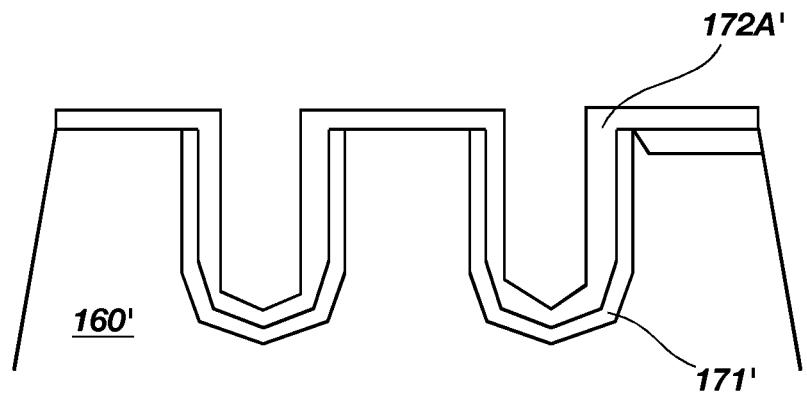
FIGS. 7B-7D illustrate cross-sectional views of various process steps in the fabrication of the recessed access device structure illustrated in FIG. 7A according to embodiments of the invention.
Figure 7C:
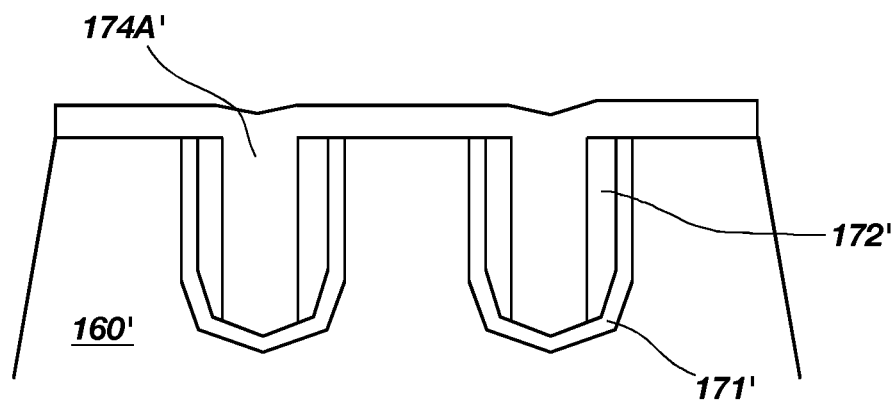
Figure 7D:
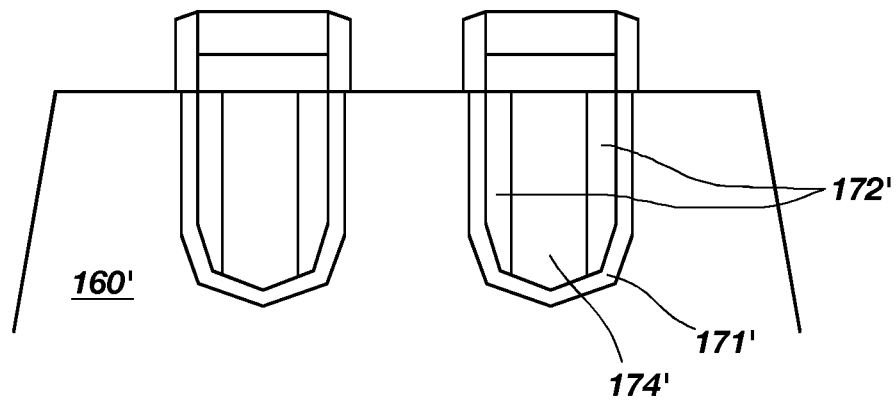

The RAD structures 170' of embodiments of the invention may be produced using fabrication processes used to form conventional semiconductor devices and particularly memory devices. For example, the RAD structures 170' illustrated in FIG. 7A may be formed using conventional CMOS or memory device fabrication processes similar to the steps illustrated in FIGS. 7B-7D. As illustrated in FIG. 7B, a semiconductor substrate 160' having trenches formed therein may be provided. Oxide 171' may be grown in the trenches as used with conventional RAD structures. A polysilicon layer 172A' may be deposited over the semiconductor substrate 160' and in the trenches. The polysilicon layer 172A' may be doped n-type according to conventional doping techniques. An isotropic spacer etch selective to the oxide 171' may be performed to remove the polysilicon layer 172A' in the bottom of a trench, leaving the n-doped polysilicon layer 172' on the sidewalls of the trench as illustrated in FIG. 7C. A second gate material layer 174A' formed of a material having a higher work function than the first gate material 172' may be deposited over the substrate 160' and in the trenches as illustrated in FIG. 7C. Masking and/or etching of the second gate material layer 174A' may be used to form the second gate material 174' as illustrated in FIG. 7D. Conventional masking, etching, doping, and deposition processes may be used to complete the formation of a RAD structure 170', including the formation of a strap 176', formation of insulator caps 180', and formation of sidewall spacers 178' as illustrated in FIG. 7A.

Although methods for forming the RAD structures 170' of particular embodiments of the invention are illustrated in FIGS. 7B-7D, it is understood that other methods and processes may also be used to fabricate RAD structures 170' according to embodiments of the invention.

When employed with access devices, such as memory devices or other semiconductor devices, the RAD structures 170' of embodiments of the invention may reduce GIDL, reduce junction leakage, reduce subthreshold leakage, and increase the drive of the access device. The combination of multiple work functions in the gate electrodes allows sub-threshold leakage to be controlled or reduced using a high work function material while also employing a low work function material to reduce GIDL. The increased margin to GIDL provided by the dual work function gate electrode allows the negative access device bias to be pushed more negative, which in turn may reduce the subthreshold leakage. The decreased subthreshold leakage may allow a less negative substrate bias to be used with embodiments of the invention to decrease junction leakage and increase the drive of the access device.

Figure 7E:
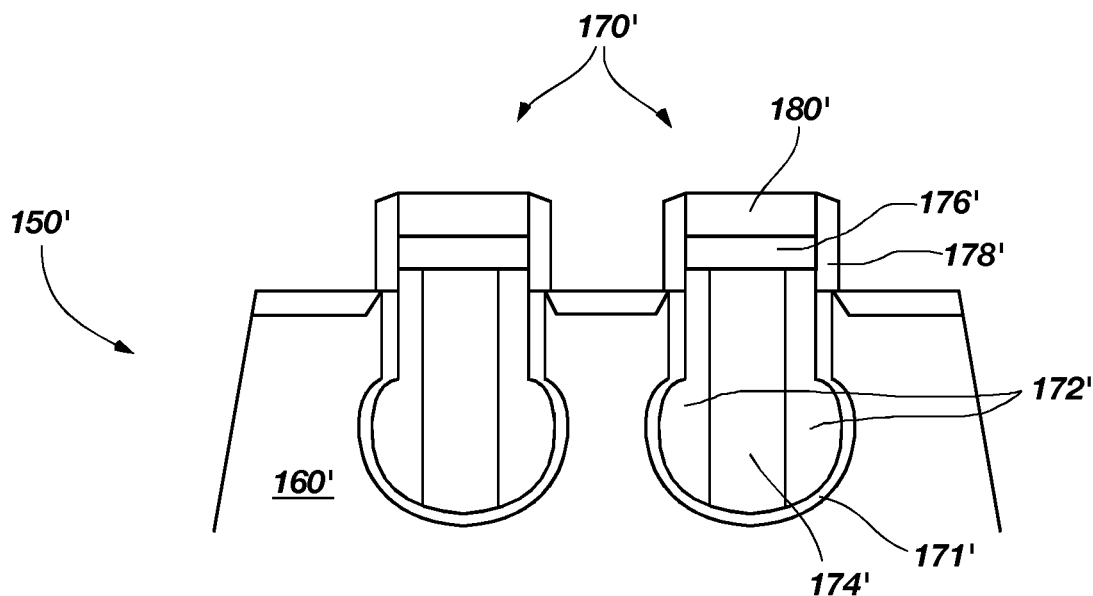
FIG. 7E illustrates a cross-sectional view of a spherical recessed access device structure according to embodiments of the invention.

Although the multi-work-function RAD structures according to embodiments of the invention have been described with respect to conventional RAD structure configurations, it is also understood that embodiments of the invention may be incorporated with spherical recessed access devices (SRAD) as well. For example, an SRAD structure according to embodiments of the invention is illustrated in FIG. 7E. The SRAD structure 170' illustrated in FIG. 7E may include the same characteristics as a RAD structure and may be formed using similar processes.

According to other embodiments of the invention, a gate electrode in an access device may be separated into two or more electrically isolated regions. The two or more electrically isolated regions may be connected to an access device driver capable of supplying the same or different voltages to each of the two or more electrically isolated regions.

Figure 8:
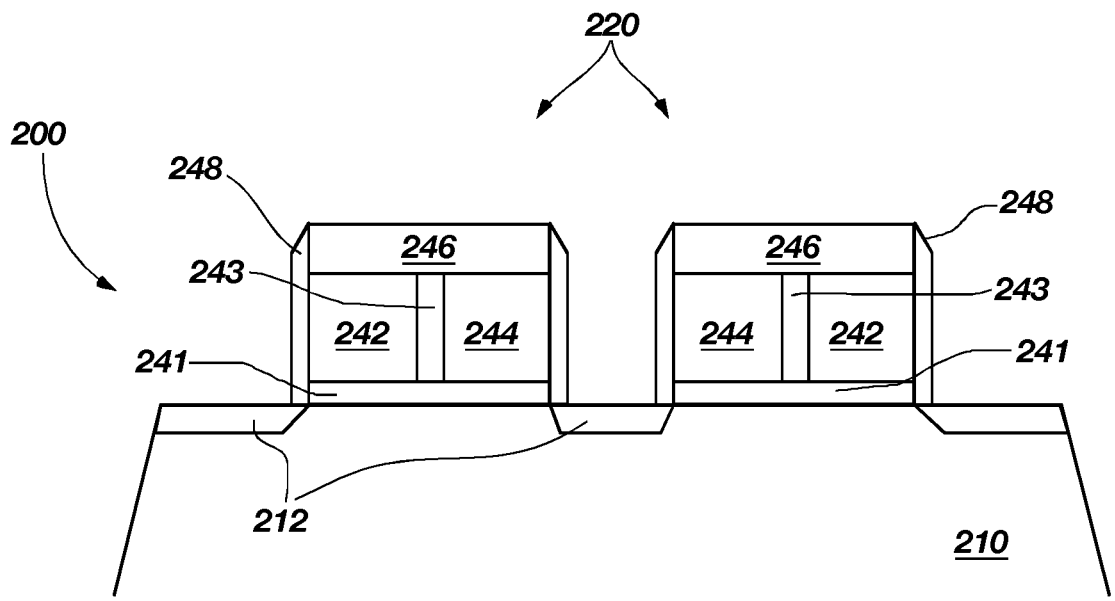
FIG. 8 illustrates a cross-sectional view of a planar access device according to embodiments of the invention.

An example of an access device 200 incorporating a gate electrode having two or more electrically isolated regions according to embodiments of the invention is illustrated in FIG. 8. The access device 200 may include one or more gate stacks 220 formed over a semiconductor substrate 210. The gate stacks 220 may be positioned next to or over active areas 212 in the semiconductor substrate 210 just as conventional gate stacks are positioned with conventional planar access devices. The gate stacks 220 may include a gate electrode overlying an oxide layer 241. The gate electrode may include a first gate material 242 and a second gate material 244 separated by an insulator layer 243. An insulator cap 246 may overlie the first gate material 242, the second gate material 244, and the insulator layer 243. The gate stack 220 may also include sidewall spacers 248 as known and used with conventional planar access device structures.

Gate stacks 220 according to embodiments of the present invention may be incorporated with access devices 200 such as memory devices, CMOS structures, or other devices and structures where conventional gate stacks may be used.

The semiconductor substrate 210 may include semiconductor substrates conventionally used with or for the fabrication of memory devices, access devices, and other semiconductor devices. In many embodiments, the semiconductor substrate 210 may include one or more silicon-containing structures such as silicon wafers, silicon-on-insulator structures, or silicon-on-sapphire structures. The active areas 212 of the semiconductor substrate 210 may be doped with an n-type, p-type, or other type dopant similar to active areas associated with conventional gate stack formations.

The first gate material 242 and the second gate material 244 of a gate stack 220 may be formed of the same material, such as polysilicon. In other embodiments, the first gate material 242 and the second gate material 244 may be formed of different materials or they may be formed of the same material but doped with different dopants to alter the characteristics of the gate materials. Although the gate stack 220 illustrated in FIG. 8 illustrate gate stacks 220 having two gate electrode regions—the first gate material 242 defining a first region and the second gate material 244 defining a second region—it is understood that two or more regions may be defined and incorporated with embodiments of the present invention. In such instances, two or more gate material regions may be separated by two or more insulator layers 243 positioned in the gate material regions.

The insulator layer 243 positioned between the first gate material 242 and the second gate material 244 may include any dielectric layer or suitable material capable of acting as an insulator between the two gate materials. For example, the insulator layer 243 may include a layer of silicon nitride (SiN), silicon dioxide (SiO$_2$), or other similar insulating material.

Insulator caps 246 and sidewall spacers 248 are used with conventional planar access devices, and the insulator caps 246 and sidewall spacers 248 incorporated with the gate stacks 220 of various embodiments of the invention may include conventional insulator caps and sidewall spacers formed according to conventional fabrication processes.

Figure 9A:
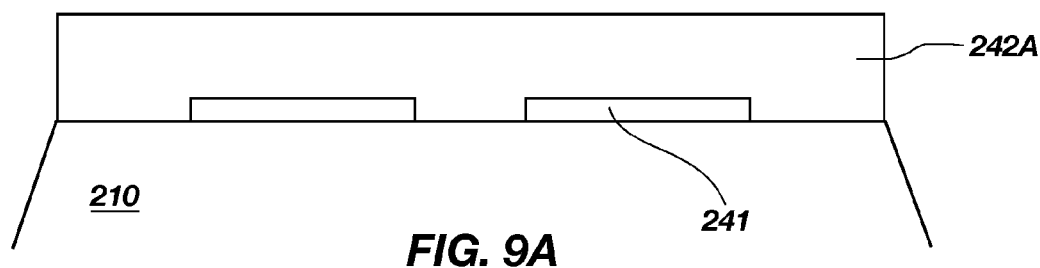
FIGS. 9A-9D illustrate cross-sectional views of various process steps in the fabrication of the planar access device illustrated in FIG. 8 according to embodiments of the invention.
Figure 9B:
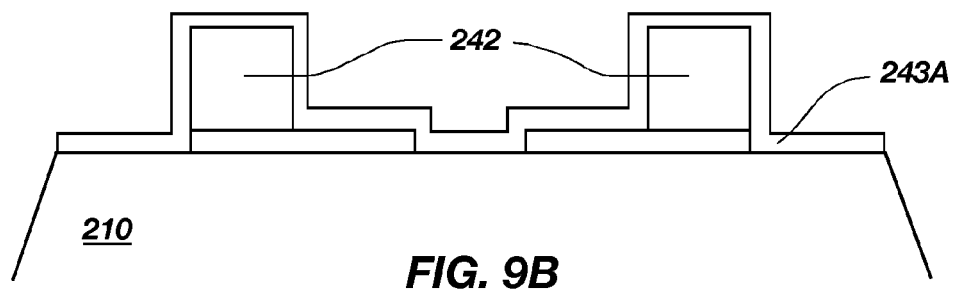
Figure 9C:
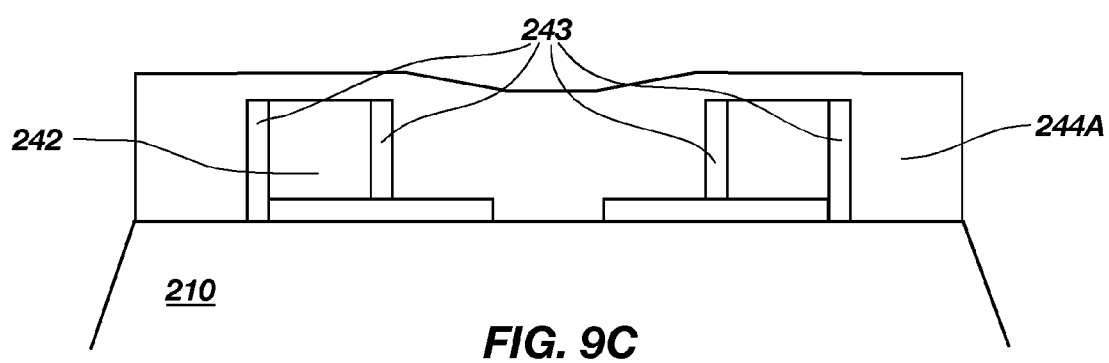
Figure 9D:
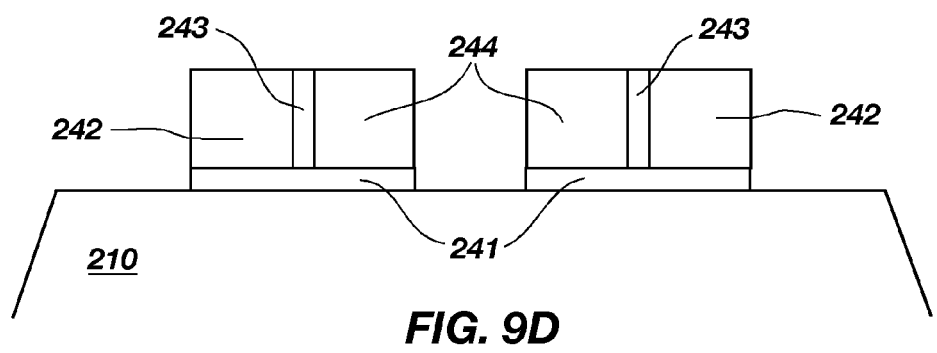

The gate stacks 220 according to embodiments of the invention may be formed using conventional gate stack fabrication processes, with the formation of the second gate material 244 and the insulator layer 243 being added to such processes. For example, processes that may be used for the fabrication of the gate stack 220 illustrated in FIG. 8 are illustrated in FIGS. 9A-9D. As illustrated in FIG. 9A, a polysilicon layer 242A may be deposited over a gate-oxide layer 241 overlying a semiconductor substrate 210. The polysilicon layer 242A may be masked and etched such that one or more first gate material 242 formations remain positioned over the oxide layer 241 as illustrated in FIG. 9B. An insulator layer 243A may be deposited over the first gate material 242 formations. The insulator layer 243A may be etched to remove all but the insulator layer 243 portions next to the first gate material 242 formations as illustrated in FIG. 9C. For example, a vertical isotropic etch may be used to etch the insulator layer 243A such that only insulator layer 243 remains on the sides of the first gate material 242. A second polysilicon layer 244A may be formed over the structure as illustrated in FIG. 9C. The second polysilicon layer 244A may be masked and etched to form the second gate material 244 formations as illustrated in FIG. 9D. Conventional masking, etching, doping, and deposition processes may be used to complete the formation of the gate stack 220 including the formation of the insulator caps 246 and sidewall spacers 248, and the doping of the active areas 212.

Although the fabrication processes illustrated in FIGS. 9A-9D show an oxide layer formed over the semiconductor substrate 210 it is understood that the oxide layer 241 may include a continuous oxide layer (not shown) across the expanse of the semiconductor substrate 210 that may be etched to the desired form during the processing steps. For example, a continuous oxide layer (not shown) may be deposited across the entire portion of a semiconductor substrate 210 where a gate stack 220 is to be formed. The components of the gate stack such as the first gate material 242, insulator layer 243, second gate material 244, and insulator cap 246 may be formed over the continuous oxide layer. The gate stack 220 and the continuous oxide layer may then be etched to form the structures illustrated in FIG. 9D.

Although methods for forming the gate stack 220 of the invention are described with respect to FIGS. 9A-9D, it is understood that other methods and processes may also be used to fabricate the gate stack 220 of the invention and that embodiments of the invention are not limited by the fabrication processes described.

The gate stacks 220 according to embodiments of the invention may be driven by an access device driver capable of providing two or more voltages to the different electrically isolated regions of the gate stacks 220 simultaneously. For instance, the gate stacks 220 illustrated in FIG. 8 may be driven by an access device driver capable of supplying a first voltage to the first gate material 242 and a second voltage to the second gate material 244. The voltages supplied by the access device driver may be selected such that the voltages applied to the first gate material 242 and the second gate material 244 are the same or different, depending on the desired "on" or "off" state of the gate stack 220.

In some embodiments, a gate stack 220 may include two or more gate materials. In such instances, an access device driver may be adapted to deliver voltages to each of the gate materials to control the operations of the gate stack 220.

According to other embodiments of the invention, a RAD structure 270 may be incorporated into an access device 250. A RAD structure 270 according to embodiments of the invention may be similar to a conventional RAD structure having a single gate material. The RAD structures 270 of particular embodiments of the invention, however, may include a first gate material 272 and a second gate material 274 separated by an insulator layer 273. For example, a RAD structure 270 according to particular embodiments of the invention is illustrated in FIG. 10.

Figure 10:
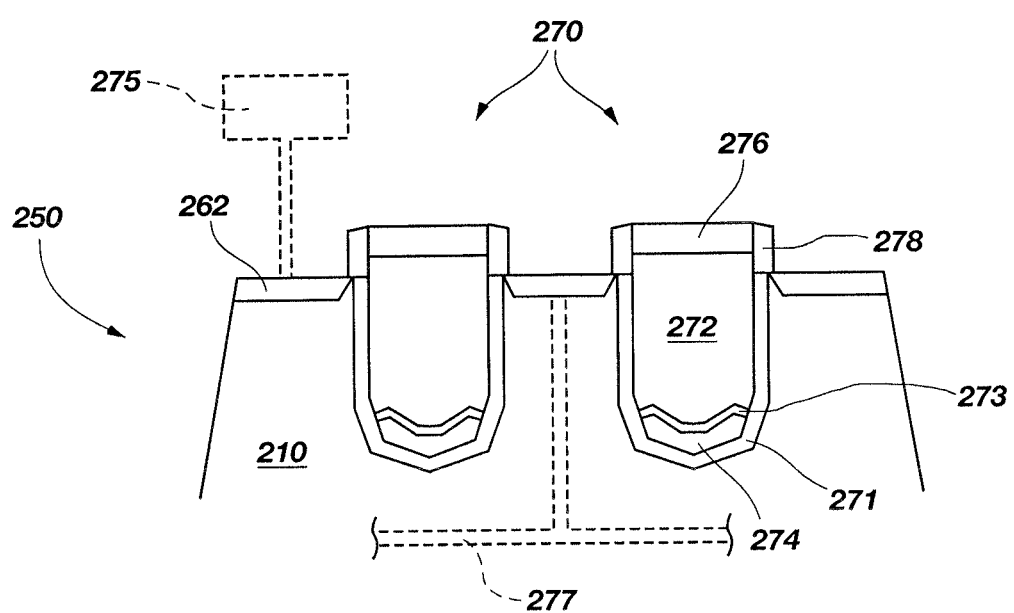
FIG. 10 illustrates a cross-sectional view of a recessed access device structure according to embodiments of the invention.

The RAD structure 270 illustrated in FIG. 10 includes two gate materials, a first gate material 272 and a second gate material 274, positioned in a trench in a semiconductor substrate 210. A gate-oxide layer 271 may coat or overlie the sides of the trench in the semiconductor substrate 210. The first gate material 272 and the second gate material 274 may be separated by an insulator layer 273. The RAD structures 270 may be positioned next to or over active areas 262 in the semiconductor substrate 210 just as RAD structures are positioned with conventional access devices. An insulator cap 276 may overlie the gate materials of a RAD structure 270 and sidewall spacers 278 may border the sides of the RAD structure 270 as illustrated in FIG. 10. The insulator cap 276 and sidewall spacers 278 may be similar to insulator caps and sidewall spacers employed with conventional RAD devices.

Although the RAD structure 270 illustrated in FIG. 10 shows a first gate material 272 and a second gate material 274 separated by an insulator layer 273, embodiments of the invention may include two or more gate materials separated by two or more insulator layers.

RAD structures 270 according to embodiments of the invention may be incorporated with access devices 250 such as memory devices, CMOS structures, or other devices and structures where RAD structures 270 may be used.

Semiconductor substrates 210 may include semiconductor substrates conventionally used with or for the fabrication of memory devices, access devices, and other semiconductor devices. In many embodiments, the semiconductor substrate 210 may include one or more silicon-containing structures such as silicon wafers, silicon-on-insulator structures, or silicon-on-sapphire structures. The active areas 262 of the semiconductor substrate 210 may be doped with an n-type, p-type, or other type dopant similar to active areas associated with conventional RAD structure formations.

The gate materials forming the first gate material 272 and the second gate material 274 may include materials used to form conventional gate electrodes. For example, the gate materials used with the RAD structures 270 according to embodiments of the invention may include materials such as polysilicon materials. The same gate material may be used to form the first gate material 272 and the second gate material 274 or the two gate materials may be formed from different gate materials. In other embodiments, the first gate material 272 and the second gate material 274 may be doped with different dopants to alter the characteristics of the gate materials. The first gate material 272 may have a lower work function than the second gate material 274 and may be located closer to a storage capacitor 275 (shown in broken lines) than the second gate material 274, which may be located closer to a bitline 277 (shown in broken lines) than the first gate material 272.

The insulator layer 273 positioned between the first gate material 272 and the second gate material 274 may include any dielectric layer or suitable material capable of acting as an insulator between the two gate materials. For example, the insulator layer 273 may include a layer of silicon nitride ($Si_3N_4$), silicon dioxide ($SiO_2$), or other similar insulating material.

The RAD structures 270 according to embodiments of the invention may be formed using conventional RAD structure fabrication processes. For example, a process that may be used to fabricate a RAD structure according to embodiments of the invention is illustrated in FIGS. 11A-11D.

Figure 11A:
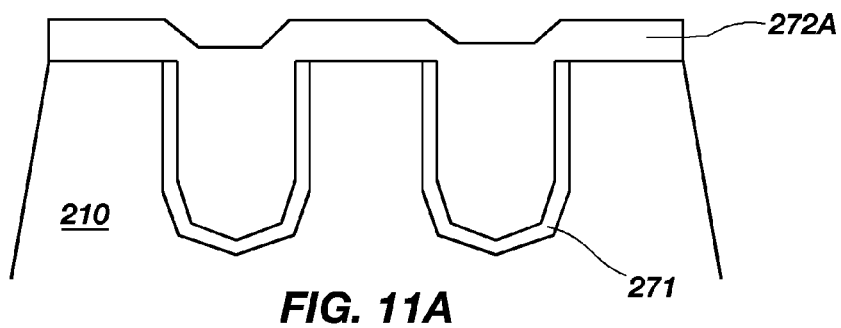
FIGS. 11A-11D illustrate cross-sectional views of various process steps in the fabrication of the recessed access device illustrated in FIG. 10 according to embodiments of the invention.
Figure 11B:
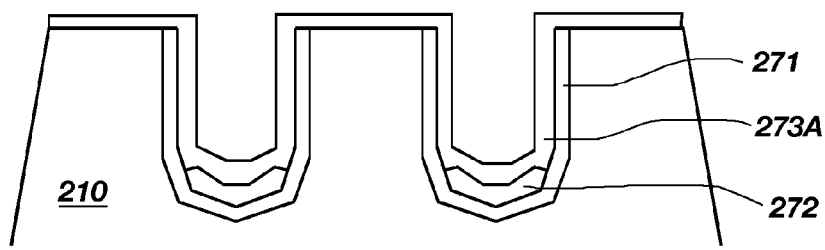
Figure 11C:
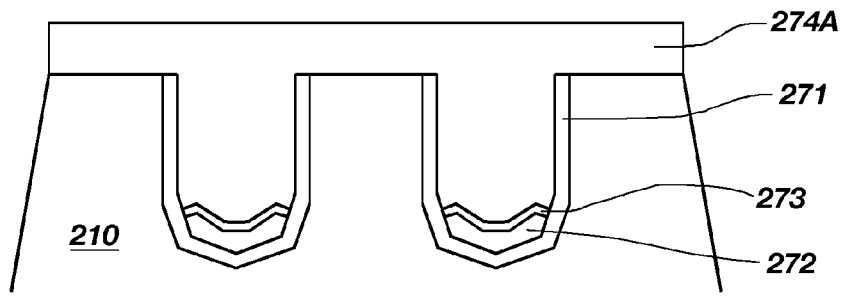
Figure 11D:
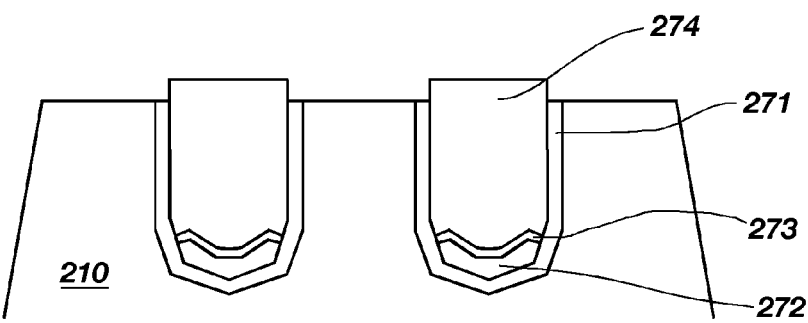

RAD structures 270 according to embodiments of the invention may be formed in a trench in a semiconductor device wherein the trench includes a gate-oxide layer as may be fabricated for conventional RAD structures. As illustrated in FIG. 11A, a polysilicon layer 272A may be deposited over a semiconductor substrate 210 having trenches lined with a gate-oxide layer 271 material. The polysilicon layer 272A may be etched, leaving a first gate material 272 deposited over the gate-oxide layer 271 in the bottom of a trench as illustrated in FIG. 11B. An insulator material layer 273A deposited over the first gate material 272 and the gate-oxide layer 271 may be etched to form the insulator layer 273 over the first gate material 272. The etching of the insulator material layer 273A may be performed so that the gate-oxide layer 271 remains on the surface of the trenches in the semiconductor substrate 210. A second polysilicon layer 274A may be deposited over the semiconductor substrate 210 and in the trenches, covering the insulator layer 273 and filling the trenches as illustrated in FIG. 11C. Selective masking and etching of the second polysilicon layer 274A forms the second gate material 274 formations as illustrated in FIG. 11D.

Conventional masking, etching, doping, and deposition processes may be used to complete the formation of the RAD structures 270 including the formation of the insulator caps 276 and sidewall spacers 278, and the doping of the active areas 262. In addition, masking of the trenches, contacts between RAD structures, and metal layers above the RAD structures may be performed such that contact may be made to the bottom portion of the RAD structure 270, and the first gate material 272, as well as to the top portion of the RAD structure 270 and the second gate material 274. The contact may be connected to an access device driver capable of supplying desired voltages to the first gate material 272 and second gate material 274.

Although methods for fabricating RAD structures 270 of the invention are described with respect to FIGS. 11A-11D, it is understood that other methods and processes may also be used to fabricate the RAD structures 270 of the invention and that embodiments of the invention are not limited by the fabrication processes described.

The RAD structures 270 according to embodiments of the invention may be driven by an access device driver capable of providing two or more voltages to the RAD structure 270 simultaneously. For example, the RAD structure 270 illustrated in FIG. 10 may be driven by an access device driver capable of supplying a first voltage to the first gate material 272 and a second voltage to the second gate material 274. The voltages supplied by the access device driver may be selected such that the voltages applied to the first gate material 272 and the second gate material 274 are the same or different, depending on the desired "on" or "off" state of the RAD structure 270.

In some embodiments, the RAD structures 270 may include two or more gate materials. In such instances, an access device driver may be adapted to deliver voltages to each of the gate materials to control the operations of the RAD structures 270.

The gate stacks 220 and RAD structures 270 having multiple electrically isolated regions according to embodiments of the invention may reduce the amount of gate induced drain leakage (GIDL), junction leakage, and subthreshold leakage while increasing the drive of the access device. The gate stacks 220 and RAD structures 270 reduce the amount of GIDL while preserving a negative gate electrode bias. This may be accomplished by applying different voltages to the first and second gate electrodes of the gate stacks 220 and RAD structures 270. Therefore, in the "off" state, one of the negative gate electrode bias may be made more negative while the other remains "off," but at a less negative bias—thereby decreasing GIDL current. The more negative word line bias on one portion of the gate results in decreased subthreshold leakage. Further, a less negative substrate bias may be used, which would decrease junction leakage and increase the drive of the access device.

According to still other embodiments of the invention, planar or recessed access devices may also include gate electrodes comprised of diodes. The incorporation of a diode structure with the gate electrode would allow two voltages to be applied to the electrode structure: a first voltage across the anode of the diode and a second voltage across the cathode of the diode.

Figure 14:
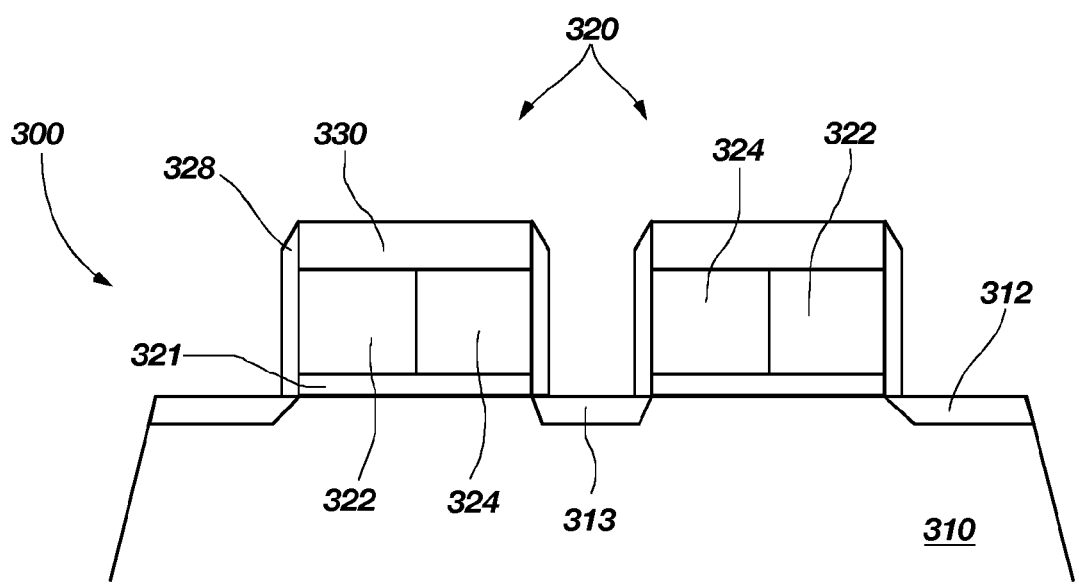
FIG. 14 illustrates a cross-sectional view of a planar access device according to embodiments of the invention.

An access device 300 utilizing a gate stack 320 constructed of a diode according to embodiments of the invention is illustrated in FIG. 14. The access device 300 may include one or more gate stacks 320 formed over a semiconductor substrate 310. The gate stacks 320 may be positioned next to or over active areas such as storage capacitors 312 and bitline contacts 313 in the semiconductor substrate 310 just as conventional gate stacks are positioned with conventional access devices. The gate stacks 320 may include a gate electrode overlying an oxide layer 321, wherein the gate electrode comprises an anode 324 and a cathode 322. The anode 324 may be positioned closest to a bitline contact 313 active area while the cathode 322 may be positioned closest to the storage capacitor 312 active areas. An insulator cap 330 may overlie the gate electrode and sidewall spacers 328 may be positioned on the sides of the gate stack 320 in a manner similar to conventional gate stacks.

The gate stacks 320 may be incorporated with access devices 300 such as memory devices, CMOS structures, or other devices and structures where gate stacks 320 may be used.

The semiconductor substrate 310 may include semiconductor substrates conventionally used with or for the fabrication of memory devices, access devices, and other semiconductor devices. In many embodiments, the semiconductor substrate 310 may include, but is not limited to, one or more silicon containing materials such as silicon, silicon-on-insulator structures, or silicon-on-sapphire structures. The bitline contacts 313 and storage capacitor 312 of the semiconductor substrate 310 may be doped with an n-type, p-type, or other type dopant to form the desired active areas, which are similar to those formed in conventional gate stack formations.

The insulator caps 330 and sidewall spacers 328 may include materials used to form the insulator caps and sidewall spacers of conventional gate stack devices.

The anode 324 of the gate stack 320 may be formed of materials conventionally used to form anodes in semiconductor devices. The anode 324 may also be formed of a doped material such as a p-type doped material. In some embodiments, the anode 324 may be formed of a Ruthenium-Tantalum ($Ru_xTa_y$) metal alloy or a tantalum nitride (TaN) metal alloy.

The cathode 322 of the gate stack 320 may be formed of materials conventionally used to form cathodes in semiconductor devices. The cathode 322 may also be formed of a doped material such as an n-type doped material. In some embodiments, the cathode 322 may be formed of a Ruthenium-Tantalum ($Ru_xTa_y$) metal alloy or a tantalum nitride (TaN) metal alloy.

Figure 15A:
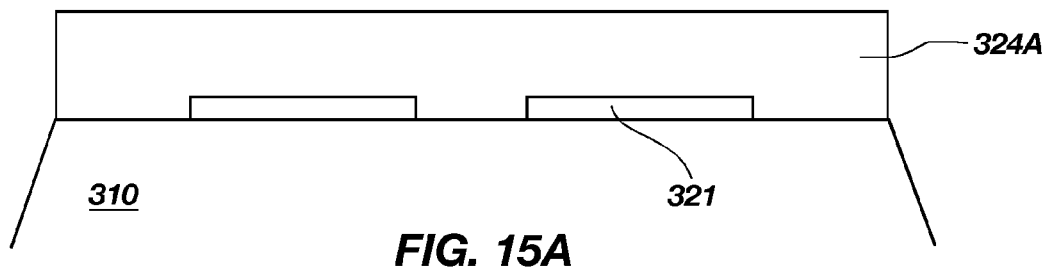
FIGS. 15A-15D illustrate cross-sectional views of various process steps in the fabrication of the planar access device illustrated in FIG. 14 according to embodiments of the invention.
Figure 15B:
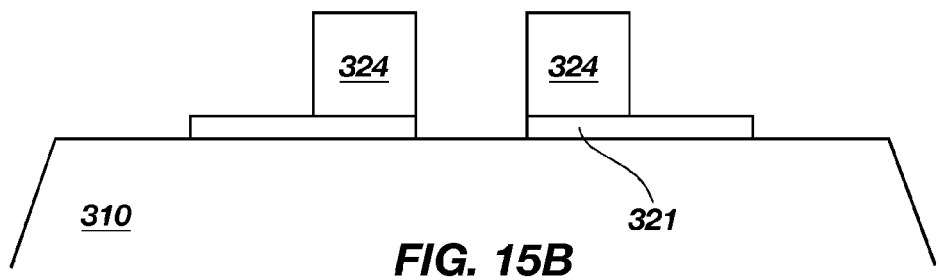
Figure 15C:
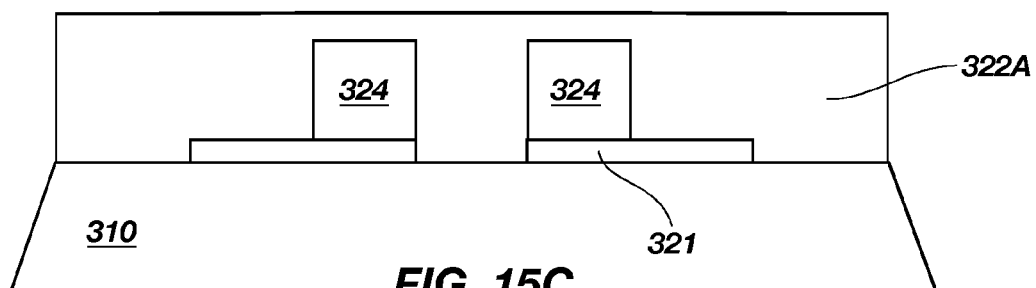
Figure 15D:
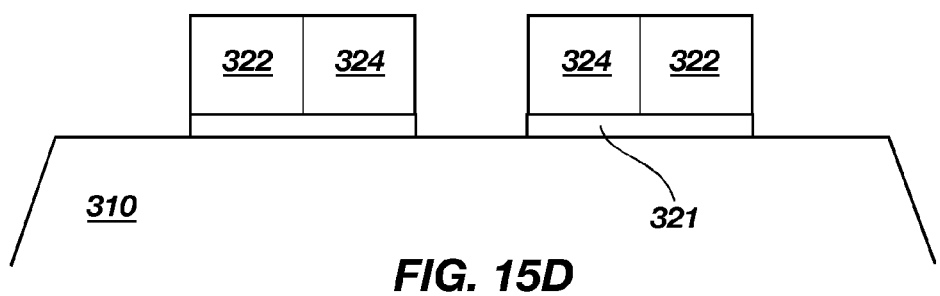

According to some embodiments of the invention, a gate stack 320 of an access device 300, such as the gate stack 320 illustrated in FIG. 14, may be fabricated according to the steps illustrated in FIGS. 15A-15D. The gate stacks 320 of embodiments of the present invention may be formed over semiconductor substrates 310 having oxide layers 321 formed thereon as with a conventional gate stack fabrication method. The oxide layer 321 may be a discontinuous oxide layer 321 as illustrated in FIG. 15A or a continuous oxide layer which is etched or otherwise partially removed to form the oxide layer 321 illustrated in FIG. 15A. As illustrated in FIG. 15A, an anode material 324A may be deposited over a semiconductor substrate 310 having oxide layers 321. The anode material 324A may be masked and etched according to conventional techniques to form anode 324 portions of the gate stack 320 as illustrated in FIG. 15B. A cathode material 322A may be deposited over the anode 324 portions of the gate stack 320 as well as the semiconductor substrate 310 having oxide layers 321 as illustrated in FIG. 15C. The cathode material 322A and anode portions may be masked and etched to form the anode 324 and cathode 322 diode structures of the gate stacks 320 as illustrated in FIG. 15D. Conventional gate stack fabrication techniques may then be used to form the insulator cap 330 and sidewall spacers 328, completing the formation of the gate stacks 320. The active areas in the semiconductor substrate 310, such as the bitline contacts 313 and storage capacitors 312, may also be formed using conventional methods of fabrication. For example, the bitline contacts 313 and the storage capacitors 312 may be doped with an n-type dopant to form N+ doped active areas.

Although the anode 324 portions of the gate stacks 320 illustrated in FIGS. 15A-15D are shown as being fabricated before the cathode 322 portions of the gate stacks 320, it is understood that the order of formation of the cathode 322 portions and anode 324 portions is not critical. Therefore, the cathode 322 portions may be formed before the anode 324 portions according to embodiments of the invention.

In addition, after the initial formation of the anode 324 portions and cathode 322 portions of the gate electrode, the structures may be masked, etched, polished, or otherwise formed such that the center of the gate stack 320 is positioned at the interface of the anode 324 portions and the cathode 322 portions of the gate stack. For instance, chemical mechanical planarization (CMP) processes may be used to form the gate stack 320 to the desired height and masking and etching processes may be used to ensure that the center of the gate stack 320 structure is located at the boundary of the anode 324 and the cathode 322.

According to embodiments of the invention, an anode material 324A and cathode material 322A may be selected such that the work function of the two materials is different. For example, in some embodiments, the cathode material 322A and anode material 324A may each comprise Ruthenium-Tantalum which may be represented by the chemical formula $Ru_xTa_y$, wherein x and y may be selected according to the desired work functions for the diode. For example, the anode 324 may be formed of an $Ru_xTa_y$ material wherein x and y are selected such that the anode 324 exhibits a work function of about 5.0 eV. The cathode 322 may be formed of an $Ru_xTa_y$ material wherein x and y are selected such that the cathode 322 exhibits a work function of about 4.2 eV. Other values of x and y may be selected such that the work functions of the two materials is different.

The gate stacks 320 according to embodiments of the invention may be formed as one long diode having approximately equal cathode 322 and anode 324 regions within the gate stack 320. The anode 324 regions may be positioned closest to the bitline contacts 313 while the cathode 322 regions may be positioned closest to the storage capacitors 312. In an "off" state, the anode 324 of a gate stack 320 is held at a negative word line voltage while the cathode 322 is held at a higher voltage than the anode 324. The difference in voltages between the cathode 322 and anode 324 creates a reverse bias across the diode. The bias level of the cathode 322 may be determined by the breakdown voltage of the reversed biased diode gate. The cathode 322 region bias level may decrease the voltage difference between the storage capacitors 312 and the gate stack 320, which in turn may decrease the electric field in the gate stack 320 area. The decreased electric field in the gate stack 320 area may help to reduce the gate-induced drain leakage in a gate stack 320 formed according to embodiments of the invention. In an "on" state, the anode 324 and the cathode 322 of the gate electrode or gate stack 320 are both driven to the same positive level as with conventional gate stack devices.

In still other embodiments of the invention, the diode of the gate stacks 320 may include a Schottky-Barrier type diode. In such instances, the anode 324 may be a metal layer and the cathode 322 may be a polysilicon material that is doped, for example, a polysilicon material that is slightly doped N+. Embodiments of the invention may also include gate stacks 320 formed of Schottky-Barrier type diodes.

Figure 16:
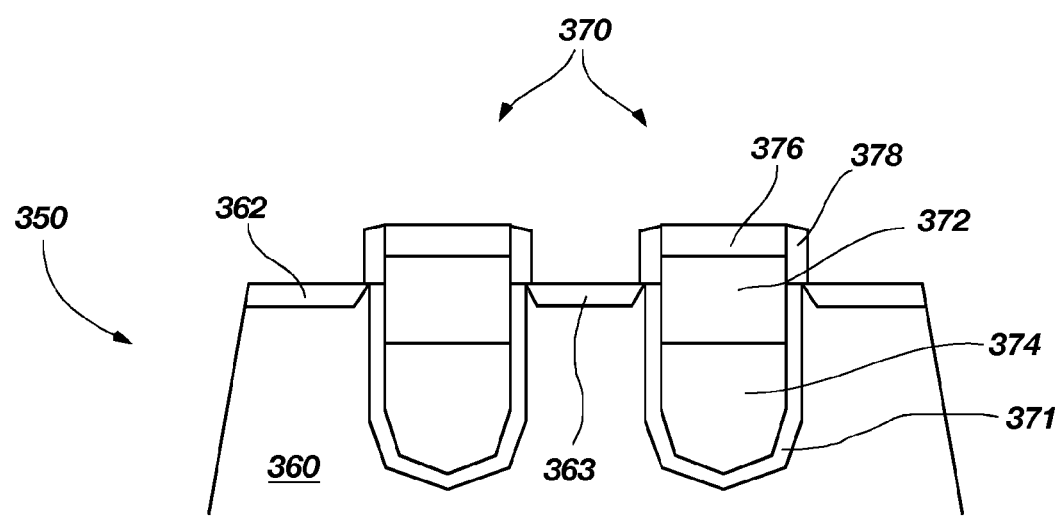
FIG. 16 illustrates a cross-sectional view of a recessed access device according to embodiments of the invention.

In other embodiments of the invention, an access device 350 may include one or more recessed access device (RAD) structures 370 comprising diodes as illustrated in FIG. 16.

The RAD structures 370 may include a diode comprised of an anode 374 and a cathode 372 formed in a trench in a semiconductor substrate 360. The anode 374 may be formed in the bottom of a trench and the cathode 372 may lie on top of the anode 374 and may extend beyond the surface of the semiconductor substrate 360. The RAD structures 370 may be positioned in trenches in a semiconductor substrate 360 just as conventional RAD structures are positioned. The trenches in the semiconductor substrate 360 may be lined with oxide 371 layers such that the cathode 372 and anode 374 may be in contact with the oxide 371 layer rather than a wall of a trench. The RAD structures 370 may also include an insulator cap 376 and sidewall spacers 378 similar to those used with conventional RAD structures.

The RAD structures 370 may be incorporated with access devices 350 such as memory devices, CMOS structures, or other conventional devices and structures employing the use of RAD structures 370.

The semiconductor substrate 360 may include semiconductor substrates conventionally used with or for the fabrication of memory devices, access devices, and other semiconductor devices. In many embodiments, the semiconductor substrate 360 may include one or more silicon-containing structures such as silicon wafers, silicon-on-insulator structures, or silicon-on-sapphire structures. The bitline contacts 363 and storage capacitors 362 of the semiconductor substrate 360 may be doped with an n-type, p-type, or other type dopant to form the desired active areas, which are similar to those formed with conventional RAD structure formations.

The insulator caps 376 and sidewall spacers 378 may include materials used to form the insulator caps and sidewall spacers of conventional gate stack devices.

The anode 374 of the RAD structure 370 may be formed of materials conventionally used to form anodes in semiconductor devices. The anode 374 may also be formed of a doped material such as a p-type doped material. In some embodiments, the anode 374 may be formed of a Ruthenium-Tantalum ($Ru_xTa_y$) metal alloy or a tantalum nitride (TaN) metal alloy.

The cathode 372 of the RAD structure 370 may be formed of materials conventionally used to form cathodes in semiconductor devices. The cathode 372 may also be formed of a doped material such as an n-type doped material. In some embodiments, the cathode 372 may be formed of a Ruthenium-Tantalum ($Ru_xTa_y$) metal alloy or a tantalum nitride (TaN) metal alloy.

Figure 17A:
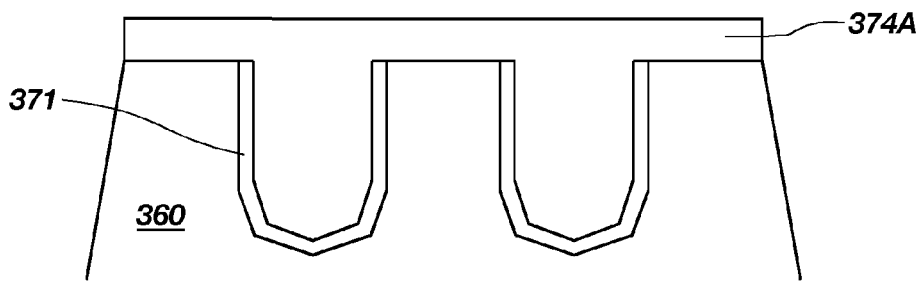
FIGS. 17A-17D illustrate cross-sectional views of various process steps in the fabrication of the recessed access device of FIG. 16 according to embodiments of the invention.
Figure 17B:
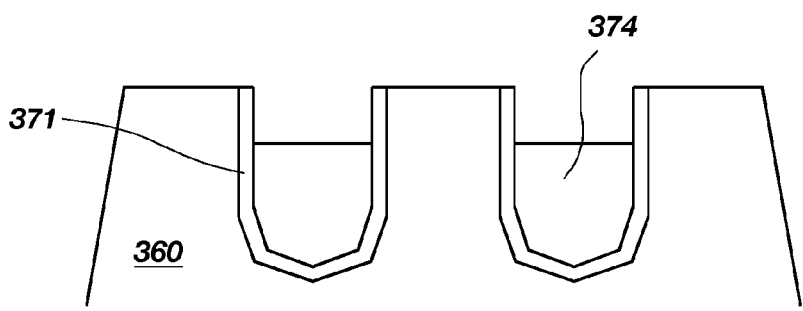
Figure 17C:
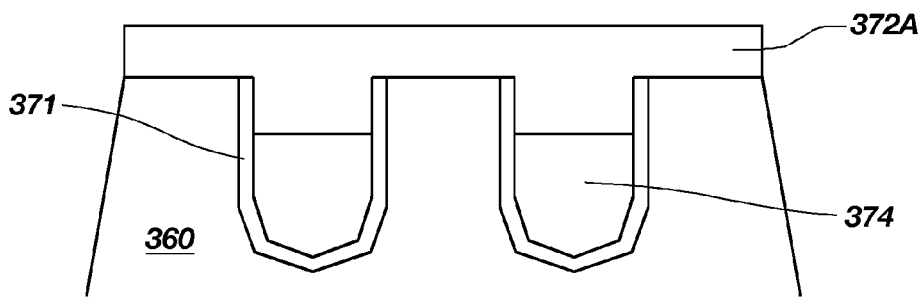
Figure 17D:
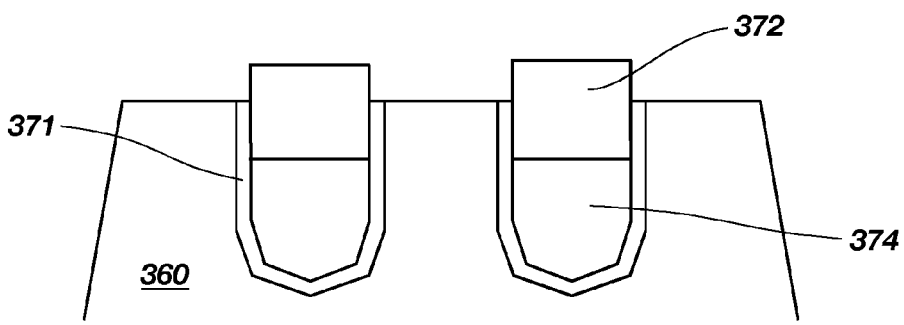

According to some embodiments of the invention, a RAD structure 370, such as that illustrated in FIG. 16, may be fabricated according to the processes illustrated in FIGS. 17A-17D. A RAD structure 370 may be fabricated in the trenches of a semiconductor substrate 360 as with conventional RAD structures. The trenches may include an oxide 371 layer, such as a gate-oxide layer, covering the surfaces of the trenches. As illustrated in FIG. 17A, an anode material 374A may be deposited over and in an oxide 371 layered trench in a semiconductor substrate 360. The anode material 374A may then be masked and etched according to conventional processes to leave a portion of the anode material 374A in the trenches which forms the anode 374 of the RAD structure 370 as illustrated in FIG. 17B. The etching of the anode material 374A to form the anode 374 may be selective to the oxide 371 layer such that the oxide 371 layer remains on the walls of the trenches. As illustrated in FIG. 17C, a cathode material 372A may then be deposited over the semiconductor substrate 360 and in the trenches over the anode 374. Deposition of the cathode material 372A may be accomplished using conventional deposition processes. The cathode material 372A may be masked and etched according to conventional processes to form the cathode 372 structure illustrated in FIG. 17D. Conventional RAD structure fabrication processes may be employed to form an insulator cap 376 and sidewall spacers 378 of the RAD structure 370 according to embodiments of the invention. The active areas in the semiconductor substrate 360, such as the bitline contacts 363 and storage capacitors 362, may also be formed using conventional processes for forming active areas. For example, the bitline contacts 363 and the storage capacitors 362 may be doped with an n-type dopant to form N+ doped active areas.

According to embodiments of the invention, the anode material 374A and cathode material 372A may be selected such that the work function of the two materials is different. For example, in some embodiments, the cathode material 372A and anode material 374A may each comprise Ruthenium-Tantalum which may be represented by the chemical formula $Ru_xTa_y$ wherein x and y may be selected according to the desired work functions for the diode. The anode 374 may be formed of an $Ru_xTa_y$ material wherein x and y are selected such that the anode 374 exhibits a work function of about 5.0 eV. The cathode 372 may be formed of an $Ru_xTa_y$ material wherein x and y are selected such that the cathode 372 exhibits a work function of about 4.2 eV. Other values of x and y may be selected such that the work functions of the formed materials are different.

The gate electrodes formed by the RAD structures 370 of particular embodiments of the invention may be formed as long diodes in the trenches of the semiconductor substrate 360. The bottom portion of the RAD structure 370 in the trenches of the semiconductor substrate 360 is the anode 374 and the top portion is the cathode 372 of the diode. When the recessed access device 350 is in an "off" state, the anode 374 may be held at a negative word line voltage while the cathode 372 may be held at a higher voltage to create a reverse biased diode. The difference in voltages between the cathode 372 and the anode 374 may create a reverse bias across the diode. The bias level of the cathode 372 may be determined by the breakdown voltage of the reversed biased diode gate. The cathode 372 region bias level may decrease the voltage difference between storage capacitors 362 and the RAD structure 370, which in turn may decrease the electric field in the gate electrode area. The decreased electric field in the RAD structure 370 area may help to reduce the gate-induced drain leakage in a RAD structure 370 formed according to embodiments of the invention. In an "on" state, both the anode 374 and the cathode 372 may be driven to the same positive level as with conventional recessed access devices.

In still other embodiments of the invention, the diode of the RAD structure 370 may be formed such that a Schottky-Barrier diode is formed in the RAD structure 370. In such instances, the anode 374 may be a metal layer deposited in the trenches of the semiconductor substrate 360 and recessed so that it remains only in the bottom of the trenches. The cathode 372 may be a polysilicon material deposited over the metal anode 374 that is doped, for example, a polysilicon material that is slightly doped N+. Embodiments of the invention may also include RAD structures 370 formed of other Schottky-Barrier type diodes.

The gate stacks 320 and RAD structures 370 according to embodiments of the invention may use two separate access device voltages to bias the diode formed by the anodes 374 and cathodes 372 of the gate electrodes. An access device driver, such as those described herein, capable of providing multiple voltage levels may be combined with the gate stacks 320 and RAD structures 370 to carry out particular embodiments of the invention.

According to other embodiments of the invention, an access device driver may be capable of driving the devices and structures of embodiments of the invention. Access device drivers and driver circuits used with embodiments of the invention may be able to turn two or more portions of the gate electrodes of a gate stack or recessed access device "on" and "off." The access device drivers of embodiments of the invention are modified to provide separate bias levels onto the anode and cathode regions of a diode in a gate electrode or onto the electrically isolated regions of a gate electrode for a planar or recessed access device.

For example, access device drivers according to embodiments of the invention may be capable of applying a negative gate electrode voltage to one portion of a gate electrode and a ground voltage to another portion of the gate electrode. Thus, the driver would be able to supply two or more voltages to the gate electrode of a planar or recessed access device.

Figure 13:
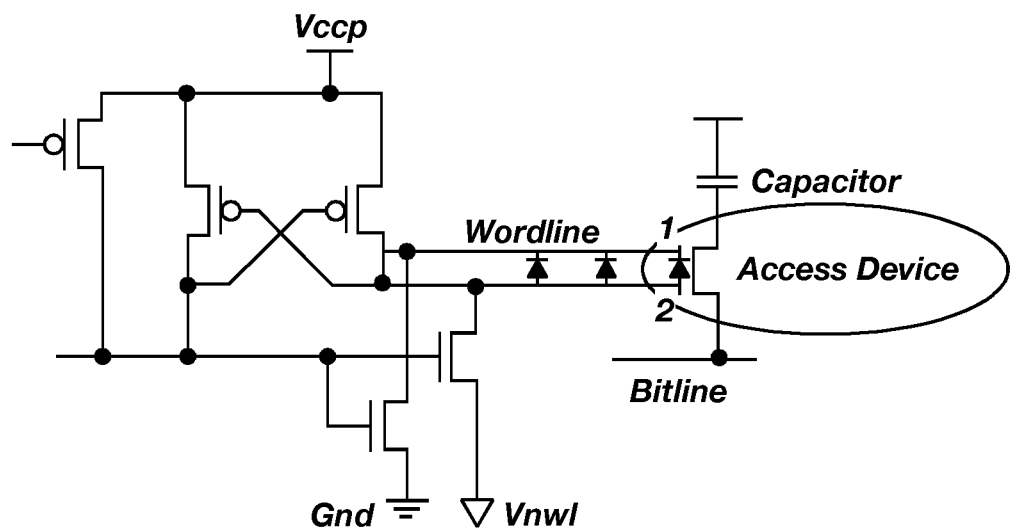
FIG. 13 illustrates an access device driver according to embodiments of the invention which may be used to supply voltages to a planar or recessed access device.

An example of an access device driver that may be used according to embodiments of the invention is illustrated in FIG. 13. The access device driver may include two outputs which may accommodate one or more diodes connected between the outputs as illustrated in FIG. 13.

For example, the access device driver illustrated in FIG. 13 may be incorporated with an access device to operate the gate stacks 220 or RAD structures 270 having two or more electrically isolated regions such as those illustrated in FIGS. 8 and 10. The contact of the access device driver labeled 1 may be connected to the second gate materials of a gate stack 220 or a RAD structure 270, while the contact of the access device driver labeled 2 may be connected to the first gate material of the same gate stack 220 or RAD structure 270. In this manner, differing bias levels may be applied by the access device driver to the first gate material and second gate material of a gate stack 220 or RAD structure 270.

Figure 12:
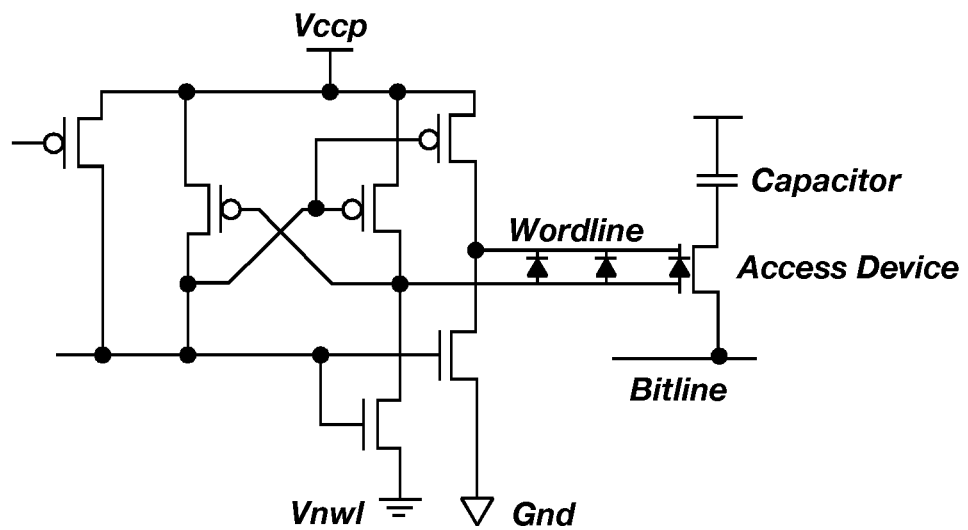
FIG. 12 illustrates an access device driver according to embodiments of the invention which may be used to supply voltages to a planar or recessed access device.

In another embodiment, an access device driver such as that illustrated in FIG. 12 may be used to supply separate bias levels to a gate stack or gate electrode of a planar or recessed access device, having a diode in the gate electrode. For example, the access device driver illustrated in FIG. 12 may be used to supply voltages to the anodes and cathodes of the planar and recessed gates electrodes illustrated in FIGS. 14 and 16, respectively.

The access device drivers according to embodiments of the invention may also include resistive devices (not shown) positioned between one of the outputs of the access device driver and the access device, such as a recessed or planar access device. In case of a defect or short between two, or more, electrically isolated regions of an access device, the presence of a resistive device between one of the outputs of the access device driver and one of the electrically isolated regions in the access device may limit the current path between the two, or more, separate power supplies utilized by the driver.

The ability to apply different bias levels to the different portions of the planar or recessed access device gate electrodes allows the amount of gate induced drain leakage (GIDL) to be controlled. Furthermore, the ability to turn one portion of the gate electrode "off" at a lower voltage than the other ensures that subthreshold leakage may be minimized. Further more, if subthreshold leakage is minimized, the substrate bias may be reduced to decrease junction leakage.

The access device drivers according to embodiments of the invention may be used with CMOS applications, memory devices such as DRAM, and with any other semiconductor devices where it may be desirable to turn different portions of a gate electrode to different "off" or "on" states to control or reduce GIDL, subthreshold leakage, or junction leakage.

Having thus described certain currently preferred embodiments of the present invention, it is understood that the invention defined by the appended claims is not to be limited by particular details set forth in the above description, as many apparent variations thereof are contemplated without departing from the spirit or scope thereof as hereinafter claimed.

What is claimed is:

1. A gate electrode, comprising:
a gate dielectric material overlying a bottom portion and sidewalls of a trench within a semiconductor substrate;
a first gate material in the trench and overlying the gate dielectric material over the bottom portion of the trench and overlying at least a portion of the gate dielectric material over the sidewalls of the trench, the first gate material having a first work function associated therewith, the first gate material comprising a P+ doped polysilicon material coupled to a first voltage supply;
a second gate material at least partially within the trench and overlying at least another portion of the gate dielectric material on the sidewalls, the second gate material having a second work function different from the first work function, the second gate material comprising a N+ doped polysilicon material coupled to a second voltage supply,
one of the first gate material and the second gate material configured to receive a first negative bias and the other of the first gate material and the second gate material configured to receive a second negative bias that is more negative than the first negative bias, the first gate material electrically isolated from the second gate material, the second gate material proximate a storage capacitor of a memory device and the first gate material proximate a bitline of the memory device,
wherein the gate dielectric material has a substantially uniform thickness from below the first gate material to a top surface of the second gate material; and
an insulator positioned between the first gate material and the second gate material, the insulator selected from the group consisting of silicon nitride and silicon dioxide and providing electrical isolation between the first gate material and the second gate material.

2. The gate electrode of claim 1, wherein the first gate material and the second gate material each contact the gate dielectric material.

3. The gate electrode of claim 1, wherein the second gate material comprises a material having a higher work function than a material of the first gate material.

4. The gate electrode of claim 1, wherein the first negative bias and the second negative bias originate from an access device driver.

5. The gate electrode of claim 1, wherein the first gate material vertically overlays the second gate material.

6. The gate electrode of claim 1, wherein an upper surface of the first gate material extends above an upper surface of an active region of the semiconductor substrate.

7. The gate electrode of claim 1, wherein each of the first gate material and the second gate material defines a nonplanar surface proximate the insulator, the nonplanar surface located at a laterally central portion of the first gate material and the second gate material.

8. The gate electrode of claim 1, wherein the insulator defines nonplanar upper and lower surfaces.

9. The gate electrode of claim 1, wherein the trench extends only in the semiconductor substrate.

10. The gate electrode of claim 1, wherein a laterally central portion of each of the first gate material and the second gate material comprises a nonplanar surface.

11. The gate electrode of claim 1, further comprising active areas comprising source and drain regions at a top portion of the semiconductor substrate and located above portions of the first gate material and the second gate material.

12. The gate electrode of claim 1, further comprising active areas comprising source and drain regions, the first gate material and the second gate material electrically isolated from the active areas at least by the gate dielectric material.

* * * * *

UNITED STATES PATENT AND TRADEMARK OFFICE
CERTIFICATE OF CORRECTION

PATENT NO. : 9,502,516 B2  
APPLICATION NO. : 14/247968  
DATED : November 22, 2016  
INVENTOR(S) : Jasper S. Gibbons et al.

Page 1 of 1

It is certified that error appears in the above-identified patent and that said Letters Patent is hereby corrected as shown below:

In the Specification  
Column 19, Line 66, change "Further more," to --Furthermore,--

Signed and Sealed this  
Seventh Day of March, 2017

Michelle K. Lee  
*Director of the United States Patent and Trademark Office*